(12) United States Patent
Akimoto et al.

(10) Patent No.: US 8,383,470 B2
(45) Date of Patent: Feb. 26, 2013

(54) THIN FILM TRANSISTOR (TFT) HAVING A PROTECTIVE LAYER AND MANUFACTURING METHOD THEREOF

(75) Inventors: Kengo Akimoto, Atsugi (JP); Masashi Tsubuku, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 27 days.

(21) Appl. No.: 12/634,084

(22) Filed: Dec. 9, 2009

(65) Prior Publication Data

US 2010/0163866 A1 Jul. 1, 2010

(30) Foreign Application Priority Data

Dec. 25, 2008 (JP) ................... 2008-330611

(51) Int. Cl.
*H01L 21/84* (2006.01)
*H01L 27/14* (2006.01)
*H01L 29/04* (2006.01)
*H01L 29/15* (2006.01)
*H01L 31/036* (2006.01)

(52) U.S. Cl. ... 438/161; 438/159; 257/72; 257/E29.117; 257/E29.151

(58) Field of Classification Search ........... 438/158, 438/159, 161; 257/72, E29.117, E29.151
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,847,410 A | 12/1998 | Nakajima |
| 6,013,930 A * | 1/2000 | Yamazaki et al. ........... 257/353 |
| 6,294,274 B1 | 9/2001 | Kawazoe et al. |
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Nakamura, A. et al., Syntheses and Crystal Structures of New Homologous Compounds, Indium Iron Zinc Oxides ($InFeO_3(ZnO)_m$(m: natural number) and Related Compounds, Kotai Butsuri (Solid State Physics), 1993, vol. 28, No. 5, pp. 317-327.

(Continued)

*Primary Examiner* — Matthew Landau
*Assistant Examiner* — Khaja Ahmad
(74) *Attorney, Agent, or Firm* — Eric J. Robinson; Robinson Intellectual Property Law Office, P.C.

(57) ABSTRACT

One of factors that increase the contact resistance at the interface between a first semiconductor layer where a channel is formed and source and drain electrode layers is a film with high electric resistance formed by dust or impurity contamination of a surface of a metal material serving as the source and drain electrode layers. As a solution, a first protective layer and a second protective layer including a second semiconductor having a conductivity that is less than or equal to that of the first semiconductor layer is stacked successively over source and drain electrode layers without exposed to air, the stack of films is used for the source and drain electrode layers.

14 Claims, 25 Drawing Sheets

U.S. PATENT DOCUMENTS

| | | | |
|---|---|---|---|
| 6,960,812 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,301,211 B2 | 11/2007 | Yamazaki et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0238886 A1* | 12/2004 | Lee et al. | 257/347 |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1* | 5/2007 | Akimoto | 257/61 |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0203387 A1 | 8/2008 | Kang et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0065771 A1 | 3/2009 | Iwasaki et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0025678 A1 | 2/2010 | Yamazaki et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0117999 A1* | 5/2010 | Matsunaga et al. | 345/204 |

FOREIGN PATENT DOCUMENTS

| | | |
|---|---|---|
| JP | 60-170972 | 9/1985 |
| JP | 60-198861 | 10/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 08-264794 | 10/1996 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |
| JP | 2006-165531 | 6/2006 |
| JP | 2007-081362 | 3/2007 |
| JP | 2007-096055 | 4/2007 |
| JP | 2007-123700 | 5/2007 |
| JP | 2007-123861 | 5/2007 |
| JP | 2007-250983 A | 9/2007 |
| WO | WO-2004/114391 | 12/2004 |
| WO | WO-2007/119386 | 10/2007 |
| WO | WO 2008126884 A1 * | 10/2008 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Osada.T et al., "15.2: Development of Driver-Integrated Panel using Amorphous In-Ga-Oxide TFT,", SID Digest '09 : SID International Symposium Digest of Technical Papers, May 31, 2009, pp. 184-187.

Li.C et al., "Modulated Structures of Homologous Compounds

InMO$_3$(ZnO)$_m$ (M=In,Ga; m=Integer) Described by Four-Dimensional Superspace Group,", Journal of Solid State Chemistry, 1998, vol. 139, pp. 347-355.

Lee.J et al., "World's Largest (15-inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, pp. 899-902.

Kanno.H et al., "White Stacked Electrophosphorecent Organic Light-Emitting Device Employing MoO$_3$ as a Change-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-277.

Park.S et al., "Challenge to Future Displays: Transparent AM-OLED Driven by Peald Grown ZnO TFT,", IMID '07 Digest, 2007, p. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID , 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "58.2 Invited Paper : Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 32, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe$_2$O$_4$, and Yb$_2$Fe$_3$O$_7$ Types of Structures for Compounds in the In$_2$O$_3$ and Sc$_2$O$_3$-A$_2$-O$_3$-BO Systems [A: Fe, Ga, or Al; B: Mg, Mn, Fe, Ni, Cu, or Zn] At Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the In$_2$O$_3$-Ga$_2$ZnO$_4$-Zno System at 1350° C" Journal of Solid State Chemistry, Aug. 1, 1991, vol. 93, No. 2, pp. 298-315.

Kimizuka et al., "Syntheses and Single-Crystal Data of Homologous Compounds, In$_2$O$_3$(ZnO)$m$ (m=3, 4, and 5), InGaO$_3$(ZnO)$_3$, and Ga$_2$O$_3$(ZnO)$m$ (m =7, 8, 9, and 16) in the In$_2$O$_3$-ZnGa$_2$O$_4$-ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, pp. 1269-1272.

Masuda et al., "Transparent thin film transistors using ZnO as an active channel layer and their electrical properties," Journal of Applied Physics, Feb. 1, 2003, vol. 93, No. 3, pp. 1624-1630.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Fortunato.E et al., "Wide-Bandgap High-Mobility Zno Thin-Film Transistors Produced At Room Temperature,", Appl. Phys. Lett. (Applied Physics Letters) , Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Nakamura.M, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

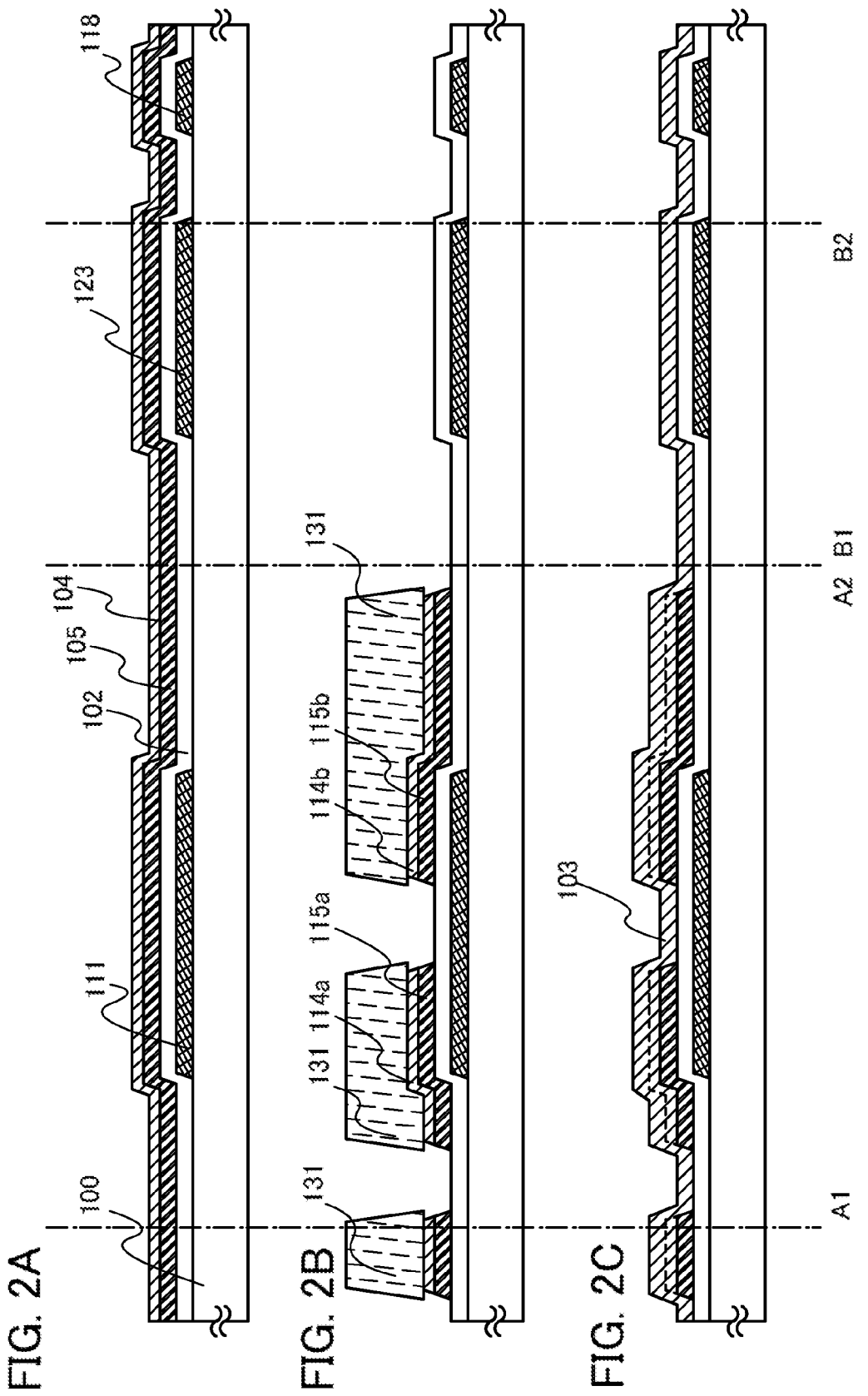

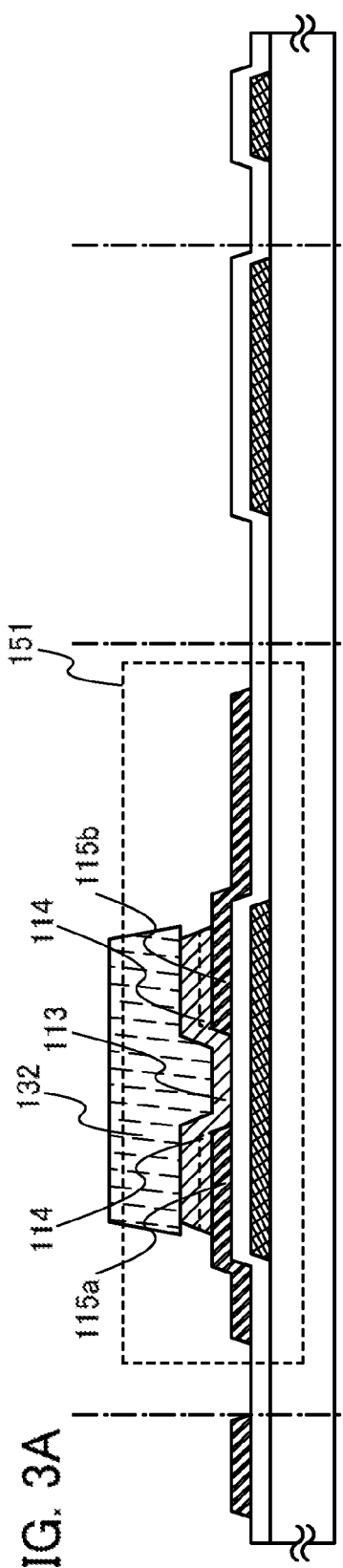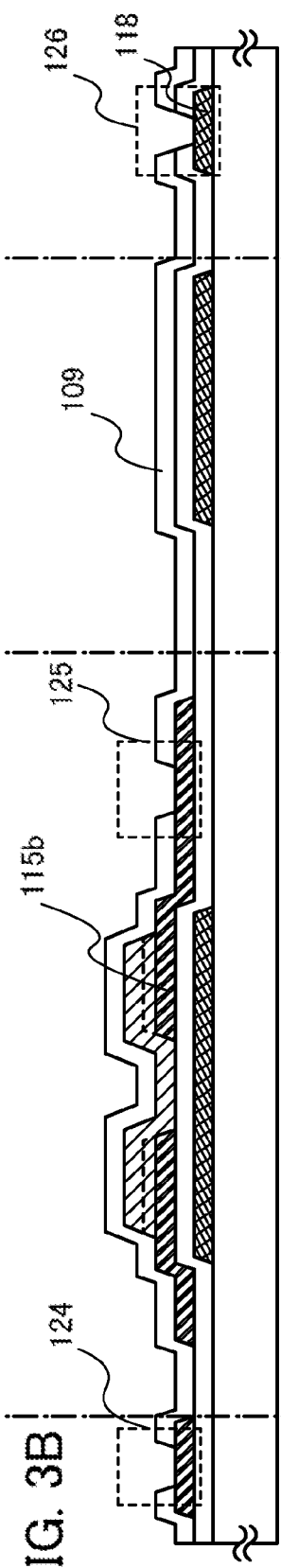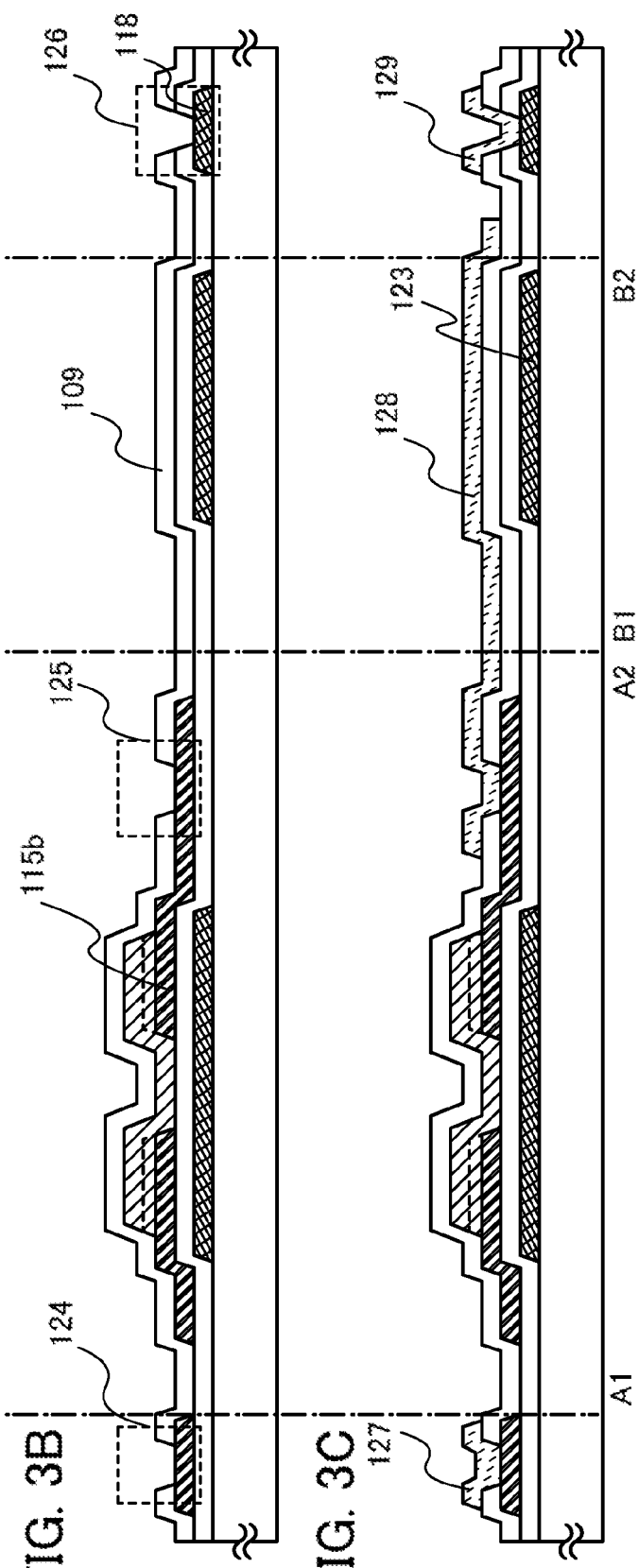

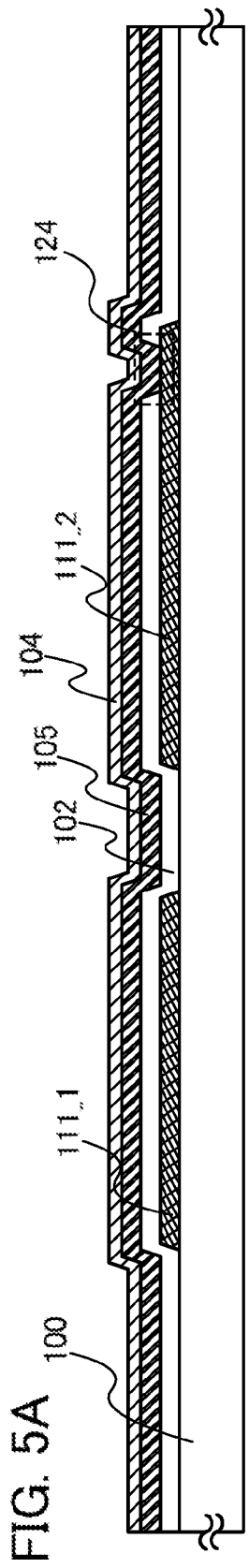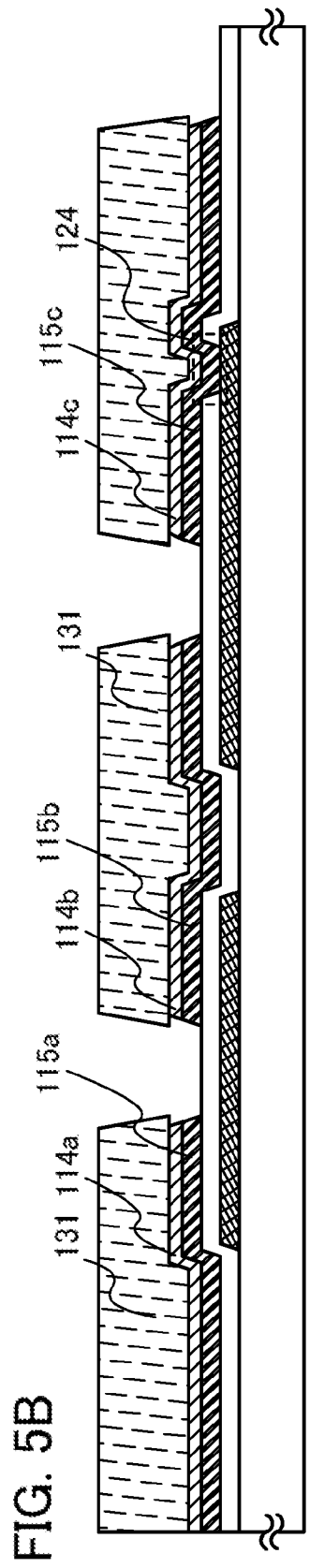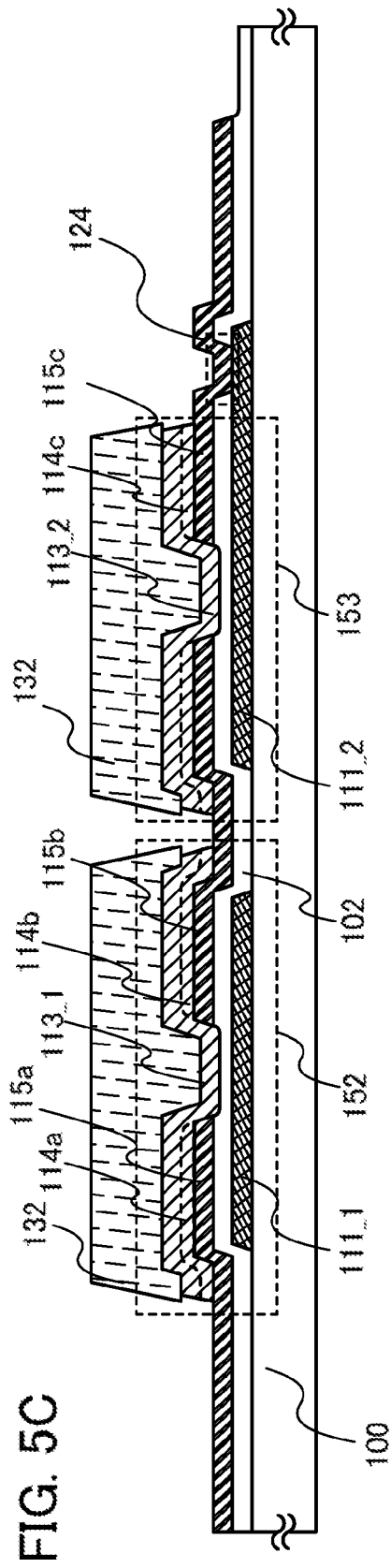

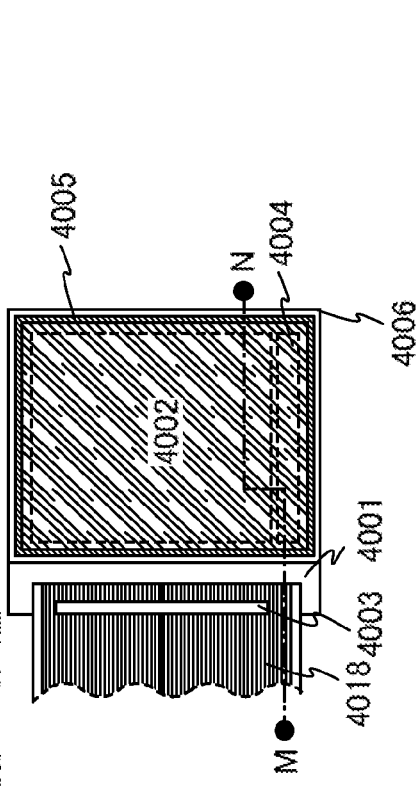
FIG. 14A1
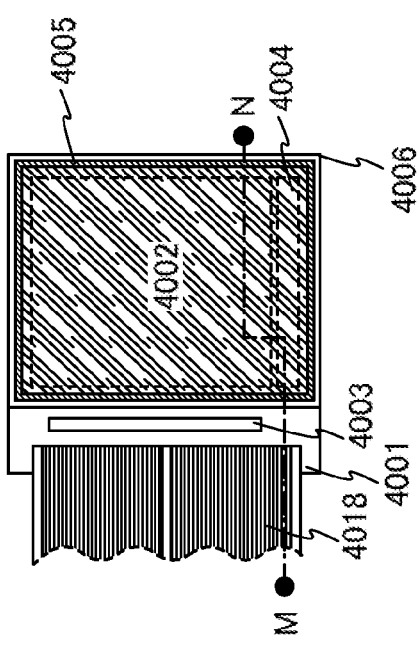
FIG. 14A2
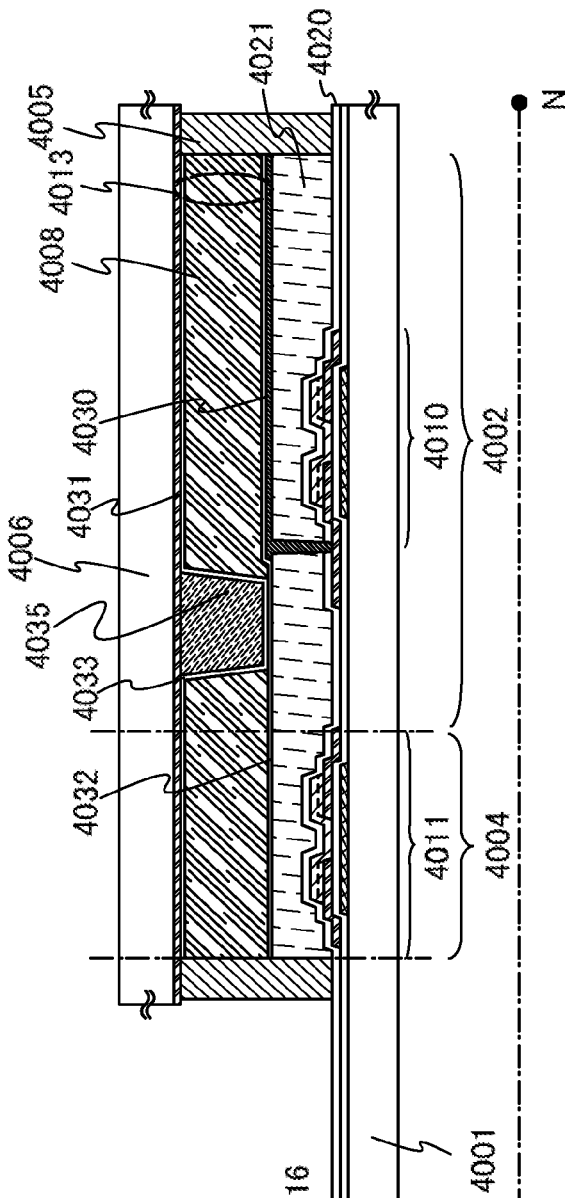
FIG. 14B

THIN FILM TRANSISTOR (TFT) HAVING A PROTECTIVE LAYER AND MANUFACTURING METHOD THEREOF

BACKGROUND OF THE INVENTION

1. Field of the Invention

The present invention relates to a semiconductor device and a manufacturing method thereof. For example, the present invention relates to a thin film transistor or a semiconductor device including an oxide semiconductor film in a channel formation region. Moreover, the present invention relates to, for example, an electro-optic device typified by a liquid crystal display panel including a thin film transistor or to a light-emitting display device including a thin film transistor and an organic light-emitting element. Furthermore, the present invention relates to an electronic appliance in which such an electro-optic device or a light-emitting display device as above is incorporated as a component.

The semiconductor device in this specification refers to all devices that can function by utilizing semiconductor characteristics; semiconductor elements, electro-optic devices, semiconductor circuits, and electronic appliances including semiconductor elements are all semiconductor devices.

2. Description of the Related Art

In recent years, active-matrix display devices (such as liquid crystal display devices, light-emitting display devices, or electrophoretic display devices) in which a switching element including a thin film transistor (hereinafter referred to as a TFT) is provided for each of display pixels arranged in matrix have been actively developed. In the active matrix display devices, a switching element is provided for each of pixels (or each of dots), and thus, there is such an advantage that the active matrix display devices can be driven at lower voltage than that of passive matrix display devices in the case where the pixel density is increased.

Meanwhile, there are a variety of kinds of metal oxides intended for many uses. Indium oxide is a well-known material and is used for a transparent electrode material necessary for a liquid crystal display or the like.

Further, some metal oxides have semiconductor characteristics. The metal oxides having semiconductor characteristics are one kind of compound semiconductor. The compound semiconductor is a semiconductor formed by two or more kinds of atoms bonded together. In general, metal oxides are insulators; however, it is known that metal oxides are semiconductors depending on the combination of elements included in the metal oxides.

For example, among metal oxides, tungsten oxide, tin oxide, indium oxide, zinc oxide, and the like are known as the metal oxides having semiconductor characteristics. The metal oxide as above is used for a transparent semiconductor layer serving as a channel formation region in a thin film transistor (as disclosed in Patent Documents 1 to 4 and Non-patent Document 1).

Examples of metal oxides include not only an oxide of a single metal element but also an oxide of a plurality of metal elements. For example, $InGaO_3(ZnO)_m$ (m is a natural number) which is a homologous compound is a known material (Non-patent Documents 2 to 4).

Then, it has been confirmed that such an In—Ga—Zn-based oxide as above is applicable to a channel layer of a thin film transistor (Patent Document 5 and Non-patent Documents 5 and 6).

Patent Documents 6 and 7 and the like disclose a technique applied to a switching element or the like of an image display device, in which a thin film transistor including such an oxide semiconductor film is formed over a light-transmitting substrate. Further, Patent Documents 8 and 9 disclose an attempt for manufacturing a light-transmitting thin film transistor by using a light-transmitting conductive film for each of a gate electrode, a source electrode, and a drain electrode. Patent Document 10 discloses a technique in which a gate insulating film is processed in an oxygen atmosphere to improve the characteristics of an interface with an oxide semiconductor film.

REFERENCES

[Patent Documents]

[Patent Document 1] Japanese Published Patent Application No. S60-198861

[Patent Document 2] Japanese Published Patent Application No. H8-264794

[Patent Document 3] Japanese Translation of PCT International Application No. H11-505377

[Patent Document 4] Japanese Published Patent Application No. 2000-150900

[Patent Document 5] Japanese Published Patent Application No. 2004-103957

[Patent Document 6] Japanese Published Patent Application No. 2007-123861

[Patent Document 7] Japanese Published Patent Application No. 2007-96055

[Patent Document 8] Japanese Published Patent Application No. 2007-123700

[Patent Document 9] Japanese Published Patent Application No. 2007-81362

[Patent Document 10] Japanese Published Patent Application No. 2006-165531

[Non-Patent Documents]

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor," *Appl. Phys. Lett.*, 17 Jun. 1996, Vol. 68 pp. 3650-3652

[Non-Patent Document 2] M. Nakamura, N. Kimizuka, and T. Mohri, "The Phase Relations in the $In_2O_3$—$Ga_2ZnO_4$—ZnO System at 1350° C.," *J. Solid State Chem.*, 1991, Vol. 93, pp. 298-315

[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System," *J. Solid State Chem.*, 1995, Vol. 116, pp. 170-178

[Non-Patent Document 4] M. Nakamura, N. Kimizuka, T. Mohri, and M. Isobe, "Homologous Series, Synthesis and Crystal Structure of $InFeO_3(ZnO)m$ (m: natural number) and its Isostructural Compound", *KOTAI BUTSURI (SOLID STATE PHYSICS)*, 1993, Vol. 28, No. 5, pp. 317-327

[Non-Patent Document 5] K. Nomura, H. Ohta, K. Ueda, T. Kamiya, M. Hirano, and H. Hosono, "Thin-film transistor fabricated in single-crystalline transparent oxide semiconductor," *SCIENCE*, 2003, Vol. 300, pp. 1269-1272

[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors," *NATURE*, 2004, Vol. 432 pp. 488-492

SUMMARY OF THE INVENTION

For a thin film transistor in which a channel formation region is formed using a semiconductor film, high-speed operation, a relatively easy manufacturing process, and sufficient reliability are required.

In forming a thin film transistor, a metal material having low resistance is used for source and drain electrode layers. In particular, when a display device with a large-area display is manufactured, a problem of signal delay due to resistance of a wiring becomes prominent. Accordingly, it is preferable that a metal material with a low electric resistance value be used for a material of a wiring and an electrode.

Moreover, in a liquid crystal display device or a display device including an organic light-emitting element, for example, in the case where the semiconductor device has large variation in transistor characteristics, there is a risk that display unevenness occurs due to the variation. In particular, in a display device including a light-emitting element, in the case where there is large variation in ON current ($I_{on}$) of TFTs (TFTs supplying current to a driver circuit or light-emitting elements arranged in pixels) arranged so as to make constant current flow in a pixel electrode layer, there is a risk that variation in luminance is generated on a display screen.

In the case where the contact resistance at the interface between a semiconductor layer including a channel formation region and source and drain electrode layers is high, a problem of signal delay is caused in a manner similar to the case of wiring resistance. Further, the variation in contact resistance leads to variation in transistor characteristics, which causes display unevenness.

There are various factors that increase the contact resistance. For example, there is a phenomenon in which a film with high electrical resistance is formed due to dust or impurity contamination of a surface of a metal material for source and drain electrode layers.

It is an object of an embodiment of the present invention to provide a semiconductor device in which a first electrode layer and a second electrode layer which serve as source and drain electrode layers are in contact with a layer including a first semiconductor where a channel is formed, via a protective layer including a second semiconductor formed over the first electrode layer and the second electrode layer, and to provide a manufacturing method thereof. Hereinafter, a layer including a first semiconductor is also referred to as a first semiconductor layer, and a layer including a second semiconductor is also referred to as a second semiconductor layer.

Examples of the first semiconductor and the second semiconductor used in this specification include a semiconductor including Group 14 element typified by Si, Ge, or SiC; a compound semiconductor such as GaAs, InP, ZnSe, CdS, or CuAlOS; a nitride semiconductor such as GaN, MN, or InN; and an oxide semiconductor such as ZnO or $CuAlO_2$. Further, each of the first semiconductor and the second semiconductor may be amorphous, microcrystalline, polycrystalline, or single crystal.

An example of each of the first semiconductor and the second semiconductor is an oxide semiconductor including any one of indium, gallium, zinc, and tin; for example, a thin film of an oxide semiconductor represented by $InMO_3(ZnO)_m$ (m>0) may be used as each of the first semiconductor layer and the second semiconductor layer, with which a thin film transistor is manufactured. Note that M represents one or more metal elements selected from Ga, Fe, Ni, Mn, or Co. For example, in some cases, M represents Ga alone, or may represent any of the above metal elements in addition to Ga, e.g., Ga and Ni or Ga and Fe. Moreover, in the oxide semiconductor, in some cases, a transition metal element such as Fe or Ni or an oxide of the transition metal is contained as an impurity element in addition to the metal element contained as M. In this specification, this thin film is also called an oxide semiconductor film including indium, gallium, and zinc or an In—Ga—Zn—O-based non-single-crystal film. Note that sodium (Na) included in the In—Ga—Zn—O-based non-single-crystal film is set to $5\times10^{18}/cm^3$ or lower, preferably $1\times10^{18}/cm^3$ or lower.

The protective layer including the second semiconductor, which is formed over a conductive film serving as the first electrode layer and the second electrode layer, prevents the formation of the film which causes the increase in contact resistance over the conductive film and makes a surface of the conductive film uniform. As a result, the parasitic resistance of a source region and a drain region of a semiconductor device is suppressed without variation and a thin film transistor with high field effect mobility is provided.

An embodiment of the present invention is a semiconductor device including a gate electrode layer, a gate insulating film over the gate electrode layer, first and second electrode layers whose end portions overlap with the gate electrode layer over the gate insulating film, protective layers each of which is provided over the first or second electrode layer, and a first semiconductor layer which overlaps with the gate electrode layer and which is in contact with the gate insulating film, side face portions of the first and second electrode layers, and side face portions and top face portions of the protective layers, wherein the protective layer has a conductivity that is less than or equal to that of the first semiconductor layer.

Another embodiment of the present invention is a semiconductor device in which the protective layer is formed using a composition including the same element as the first semiconductor layer.

Another embodiment of the present invention is a semiconductor device in which the first semiconductor layer is formed using an oxide semiconductor.

An embodiment of the present invention is a semiconductor device in which the first semiconductor layer is formed using an oxide semiconductor including indium, gallium, and zinc.

Another embodiment of the present invention is a semiconductor device in which a second semiconductor layer which has a conductivity that is less than or equal to that of the first semiconductor layer and which has smaller thickness than the first semiconductor layer is formed over the first and second electrode layers.

Another embodiment of the present invention is a semiconductor device including first and second electrode layers, protective layers each of which is provided over the first or second electrode layer, a first semiconductor layer which is in contact with side face portions of the first and second electrode layers and side face portions and top face portions of the protective layers, a gate insulating film over the first semiconductor layer, and a gate electrode layer which overlaps with end portions of the first and second electrode layers via the gate insulating film, wherein the protective layer has a conductivity that is less than or equal to that of the first semiconductor layer.

Another embodiment of the present invention is a semiconductor device in which the protective layer is formed using a composition including the same element as the first semiconductor layer.

Another embodiment of the present invention is a semiconductor device in which the first semiconductor layer is formed using an oxide semiconductor.

Another embodiment of the present invention is a semiconductor device in which the first semiconductor layer is formed using an oxide semiconductor including indium, gallium, and zinc.

Another embodiment of the present invention is a semiconductor device in which a second semiconductor layer which has a conductivity that is less than or equal to that of the first semiconductor layer and which has smaller thickness than the first semiconductor layer is formed over the first and second electrode layers.

Another embodiment of the present invention is a method for manufacturing a semiconductor device, including the steps of forming a gate electrode layer, forming a gate insulating film over the gate electrode layer, forming first and second electrode layers over the gate insulating film, forming protective layers each of which is provided over the first or second electrode layer, and forming a first semiconductor layer which overlaps with the gate electrode layer and which is in contact with the gate insulating film, side face portions of the first and second electrode layers, and side face portions and top face portions of the protective layers, wherein the protective layer has a conductivity that is less than or equal to that of the first semiconductor layer.

Another embodiment of the present invention is a method for manufacturing a semiconductor device, including the steps of forming first and second electrode layers, forming protective layers each of which is provided over the first or second electrode layer, forming a first semiconductor layer which is in contact with side face portions of the first and second electrode layers and side face portions and top face portions of the protective layers, forming a gate insulating film over the first semiconductor layer, and forming a gate electrode layer which overlaps with end portions of the first and second electrode layers via the gate insulating film, wherein the protective layer has a conductivity that is less than or equal to that of the first semiconductor layer.

Another embodiment of the present invention is the method for manufacturing a semiconductor device, further including the step of forming a stack of films by forming a conductive film and then successively forming a second semiconductor layer over the conductive film without the conductive film exposed to air, wherein the first and second electrode layers each including the protective layer are formed by using the stack of films.

According to an embodiment of the present invention, a semiconductor device in which first and second electrode layers serving as source and drain electrode layers are in contact with a layer including a first semiconductor where a channel is formed, via protective layers each including a second semiconductor formed over the first or second electrode layer can be provided, and a manufacturing method thereof can be provided.

BRIEF DESCRIPTION OF THE DRAWINGS

FIGS. 2A to 2C are cross-sectional views for describing steps of manufacturing a semiconductor device of an embodiment of the present invention.

FIGS. 3A to 3C are cross-sectional views for describing steps of manufacturing a semiconductor device of an embodiment of the present invention.

FIGS. 5A to 5C are cross-sectional views for describing steps of manufacturing a semiconductor device of an embodiment of the present invention.

FIGS. 14A1 and 14A2 are top views and FIG. 14B is a cross-sectional view, all for describing a semiconductor device of an embodiment of the present invention.

DETAILED DESCRIPTION OF THE INVENTION

Figure 1A:
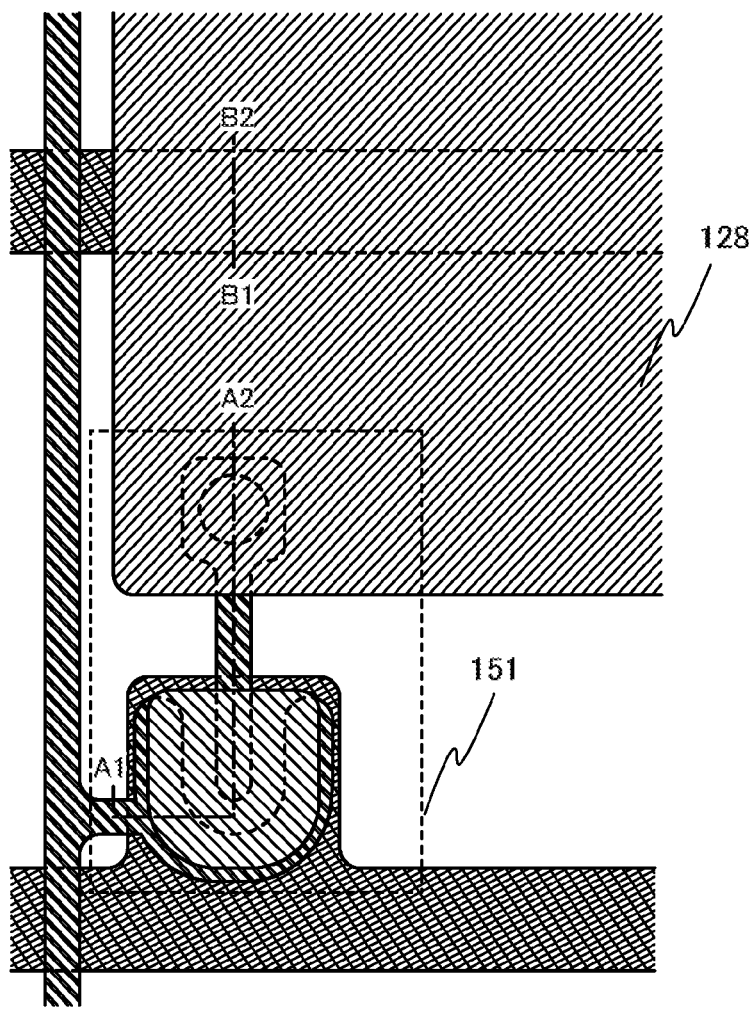
FIG. 1A is a plan view and FIG. 1B is a cross-sectional view both for describing a semiconductor device of an embodiment of the present invention.

Embodiments and Example of the present invention are hereinafter described in detail with reference to the accompanying drawings. However, the present invention is not limited to the description given below and it is easily understood by those skilled in the art that modes and details disclosed herein can be modified in various ways without departing from the spirit and the scope of the present invention. Therefore, the present invention is not construed as being limited to description of the Embodiments and Example below. Note that, in the structures of the present invention described hereinafter, the same reference numerals denote the same parts or parts having the similar functions in different drawings and the explanation will not be repeated.

[Embodiment 1]

Embodiment 1 describes a thin film transistor as an example of a semiconductor device, and a manufacturing process thereof. In specific, a process for manufacturing a pixel portion of a display device including a thin film transistor is described.

Figure 1B:
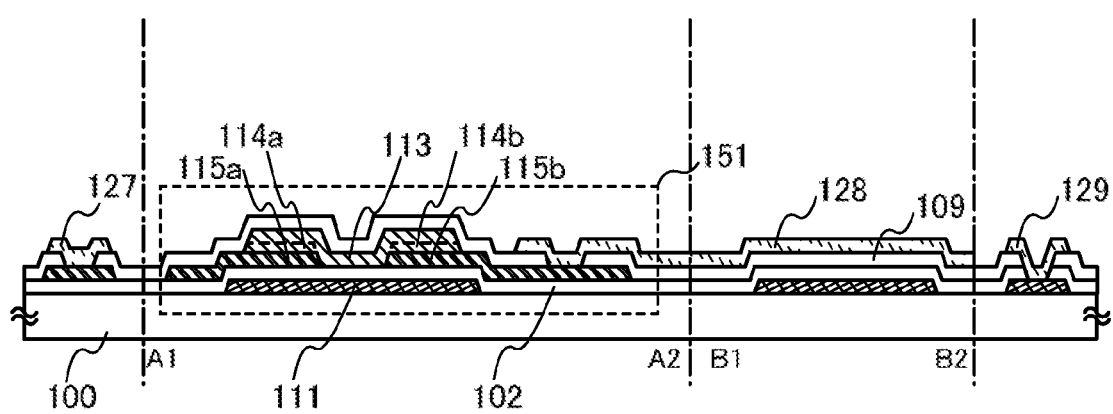

FIGS. 1A and 1B illustrate a thin film transistor of Embodiment 1. FIG. 1A is a plan view and FIG. 1B is a cross-sectional view taken along lines A1-A2 and B1-B2 in FIG. 1A.

In a thin film transistor 151 illustrated in FIGS. 1A and 1B, a gate electrode layer 111 is formed over a substrate 100, a gate insulating film 102 is formed over the gate electrode layer 111, and a first electrode layer 115a and a second electrode layer 115b serving as a source electrode layer and a drain electrode layer are formed over the gate insulating film 102 so that end portions of the first electrode layer 115a and the second electrode layer 115b overlap with the gate electrode layer 111. A first oxide semiconductor layer 113 is provided so as to overlap with the gate electrode layer 111 and to be in contact with the gate insulating film 102, side face portions of the first electrode layer 115a and the second electrode layer 115b, and side face portions and top face portions of a first protective layer 114a and a second protective layer 114b.

In other words, the gate insulating film 102 exists in the entire region including the thin film transistor 151, the gate electrode layer 111 is provided between the gate insulating film 102 and the substrate 100, a wiring is provided over the gate insulating film 102 in addition to the first electrode layer 115a and the second electrode layer 115b serving as the source electrode layer and the drain electrode layer, the first oxide semiconductor layer 113 is provided over the first electrode layer 115a and the second electrode layer 115b, the first protective layer 114a is provided between the first oxide semiconductor layer 113 and the first electrode layer 115a, the second protective layer 114b is provided between the first oxide semiconductor layer 113 and the second electrode layer 115b, and the wiring extends beyond the outer periphery of the first oxide semiconductor layer 113.

The first oxide semiconductor layer 113 of Embodiment 1 is formed using an In—Ga—Zn—O-based non-single-crystal film. The composition ratio of the In—Ga—Zn—O-based non-single-crystal film depends on the deposition condition. In an example of the deposition condition, a target (In:Ga:Zn=1:1:0.5) which includes indium oxide ($In_2O_3$), gallium oxide ($Ga_2O_3$), and zinc oxide (ZnO) is set to $1:1:4=In_2O_3:Ga_2O_3:ZnO$) is used, and the argon gas flow rate in a sputtering method is set to 40 sccm. This deposition condition is defined as Condition 1. In another example of the deposition condition, the same target is used, and the argon gas flow rate and the oxygen gas flow rate in a sputtering method are set to 10 sccm and 5 sccm, respectively. The latter deposition condition is defined as Condition 2.

The typical composition ratio of an oxide semiconductor film, which is measured by inductively coupled plasma mass spectrometry (ICP-MS) is $InGa_{0.95}Zn_{0.41}O_{3.33}$ in the case of being deposited under Condition 1, and is $InGa_{0.94}Zn_{0.40}O_{3.31}$ in the case of being deposited under Condition 2.

The typical composition ratio of an oxide semiconductor film, which is measured by Rutherford backscattering spectrometry (RBS) is $InGa_{0.93}Zn_{0.44}O_{3.49}$ in the case of being deposited under Condition 1, and is $InGa_{0.92}Zn_{0.45}O_{3.86}$ in the case of being deposited under Condition 2.

According to observation in the analysis by X-ray diffraction (XRD), the crystal structure of the In—Ga—Zn—O-based non-single-crystal film is amorphous. Note that the In—Ga—Zn—O-based non-single-crystal film as the sample to be measured is formed in such a manner that, after the deposition by a sputtering method, thermal treatment is performed at 200° C. to 500° C., typically 300° C. to 400° C., for 10 minutes to 100 minutes.

The above measurement values of the oxide semiconductor are just examples, and the oxide semiconductor which is $InMO_3(ZnO)_m$ (m>0) can be used for the first oxide semiconductor layer 113. Note that M represents one or more metal elements selected from Ga, Fe, Ni, Mn, or Co.

The first protective layer 114a is provided between and in contact with the first oxide semiconductor layer 113 and the first electrode layer 115a, and the second protective layer 114b is provided between and in contact with the first oxide semiconductor layer 113 and the second electrode layer 115b. Moreover, the first protective layer 114a and the second protective layer 114b each include a semiconductor having a conductivity that is less than or equal to that of the first oxide semiconductor layer 113. In Embodiment 1, an oxide semiconductor film including indium, gallium, and zinc with the same composition as the first oxide semiconductor layer 113 is formed as a second oxide semiconductor film and used for the protective layer.

After a conductive film serving as the first electrode layer 115a and the second electrode layer 115b is formed, the second semiconductor layer serving as the protective layer is successively formed over the conductive film without exposure to air, whereby a stack of films is formed. Accordingly, a film contaminated with dust or impurities that increases contact resistance is not formed at an interface between the conductive film and the second oxide semiconductor layer.

In this manner, the first protective layer 114a and the second protective layer 114b prevent that the film that causes the contact resistance to increase is formed over surfaces of the first electrode layer 115a and the second electrode layer 115b; therefore, the parasitic resistance of the source region and the drain region of the thin film transistor 151 is suppressed without variation. As a result, a thin film transistor with high electrical characteristics such as excellent on/off ratio, reduced variation, and high reliability can be provided.

Note that the on/off ratio refers to a ratio ($I_{on}/I_{off}$) of on current ($I_{on}$), which flows between a source electrode and a drain electrode when a transistor is on, to off current, which flows between the source electrode and the drain electrode when the transistor is off. It can be said that as the on/off ratio is higher, the switching characteristic is better, and the high on/off ratio contributes to, for example, improvement of contrast of display.

Next, a method for manufacturing the thin film transistor 151 in FIGS. 1A and 1B is described with reference to FIGS. 2A to 2C and FIGS. 3A to 3C.

In FIG. 2A, any of the following substrates can be used as the substrate 100: an alkali-free glass substrate formed using barium borosilicate glass, aluminoborosilicate glass, aluminosilicate glass, or the like manufactured by a fusion method or a float method; a ceramic substrate; a plastic substrate having heat resistance enough to withstand a process temperature of this manufacturing process; and the like. For example, a glass substrate which includes more barium oxide (BaO) than boron oxide ($B_2O_3$) in composition ratio and whose strain point is 730° C. or higher is preferable. This is because the glass substrate is not strained even when the oxide semiconductor layer is thermally processed at high temperatures of about 700° C.

Alternatively, a metal substrate such as a stainless steel alloy substrate, the surface of which is provided with an insulating film may be used. When the substrate 100 is mother glass, the substrate may have any of the following sizes: the first generation (320 mm×400 mm), the second generation (400 mm×500 mm), the third generation (550 mm×650 mm), the fourth generation (680 mm×880 mm, or 730 mm×920 mm), the fifth generation (1000 mm×1200 mm, or 1100 mm×1250 mm), the sixth generation (1500 mm×1800 mm), the seventh generation (1900 mm×2200 mm), the eighth generation (2160 mm×2460 mm), the ninth generation (2400 mm×2800 mm, or 2450 mm×3050 mm), the tenth generation (2950 mm×3400 mm), and the like.

Further, an insulating film may be provided as a base film over the substrate 100. The base film can be formed to have a single-layer structure or a stacked structure of a silicon oxide film, a silicon nitride film, a silicon oxynitride film, and/or a silicon nitride oxide film by a CVD method, a sputtering method, or the like.

Next, a conductive film serving as a gate wiring including the gate electrode layer 111, a capacitor wiring, and a terminal portion is formed. The conductive film can be formed using titanium (Ti), tantalum (Ta), tungsten (W), molybdenum (Mo), chromium (Cr), platinum (Pt), copper (Cu), gold (Au), silver (Ag), or the like. Above all, a low-resistant conductive material such as aluminum (Al) or copper (Cu) is preferable; however, since aluminum alone has disadvantages such as low heat resistance and a tendency to be corroded, aluminum is used in combination with a material having both heat resistance and conductivity to form the conductive film.

When the conductive film includes aluminum as a first component, it is preferable to use an element such as titanium (Ti), tantalum (Ta), tungsten (W), molybdenum (Mo), chromium (Cr), neodymium (Nd), scandium (Sc), nickel (Ni), platinum (Pt), copper (Cu), gold (Au), silver (Ag), manganese (Mn), carbon (C), or silicon; an alloy material including any of these elements as its main component; or an aluminum alloy to which a compound is added.

Alternatively, a stack in which a conductive film including a heat-resistant conductive material is formed over a low-resistant conductive film can be used. As the heat-resistant conductive material, any of the following materials may be used: an element selected from titanium (Ti), tantalum (Ta), tungsten (W), molybdenum (Mo), chromium (Cr), neodymium (Nd), or scandium (Sc); an alloy including any of these elements as a component; an alloy including any of these elements in combination; and a nitride including any of these elements as a component.

Further, the conductive film may be a transparent conductive film, and as a material thereof, indium tin oxide ($In_2O_3$—$SnO_2$, abbreviated as ITO), indium tin oxide including silicon or silicon oxide, indium zinc oxide, zinc oxide, or the like can be used.

The conductive film serving as the gate electrode layer 111 is formed to have a thickness of 50 nm or more and 300 nm or less by a sputtering method or a vacuum evaporation method. By forming the gate electrode layer 111 to a thickness of 300 nm or less, disconnection of the semiconductor film and the wiring which are to be formed later can be prevented. Further, by forming the gate electrode layer 111 to a thickness of 50 nm or more, the resistance of the gate electrode layer 111 can be reduced and thus the size of the substrate can be increased.

In Embodiment 1, a film including aluminum as a first component and a titanium film are stacked to be formed as the conductive film entirely over the surface of the substrate 100 by a sputtering method.

Next, a resist mask formed using a first photomask in Embodiment 1 is used and an unnecessary portion of the conductive film formed over the substrate 100 is etched, whereby a gate wiring including the gate electrode layer 111, a capacitor wiring, and a terminal are formed. In this case, the etching is performed so that at least an end portion of the gate electrode layer 111 is tapered.

Next, the gate insulating film 102 is formed over the gate electrode layer 111. As examples of the insulating film that can be used as the gate insulating film 102, there are a silicon oxide film, a silicon nitride film, a silicon oxynitride film, a silicon nitride oxide film, an aluminum oxide film, an aluminum nitride film, a magnesium oxide film, a yttrium oxide film, a hafnium oxide film, and a tantalum oxide film.

Note that a silicon oxynitride film means a film that contains more oxygen than nitrogen and includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, a silicon nitride oxide film means a film that contains more nitrogen than oxygen and includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

The gate insulating film 102 may be a single layer or a stack of two or three insulating films. For example, when the gate insulating film 102 to be in contact with the substrate is formed using a silicon nitride film or a silicon nitride oxide film, the adhesion between the substrate 100 and the gate insulating film 102 is increased. In the case where a glass substrate is used as the substrate 100, an impurity in the substrate 100 can be prevented from diffusing into the first oxide semiconductor layer 113 and further, the gate electrode layer 111 can be prevented from being oxidized. That is to say, film peeling can be prevented, and thus electric characteristics of the thin film transistor which is completed later can be improved.

The gate insulating film 102 is formed to have a thickness of 50 nm to 250 nm The thickness of the gate insulating film 102 is preferably 50 nm or more because the unevenness of the gate electrode layer 111 can be decreased.

In Embodiment 1, a silicon oxide film with a thickness of 100 nm is formed as the gate insulating film 102 by a plasma CVD method or a sputtering method.

The gate insulating film 102 may be subjected to plasma treatment before the formation of a conductive film 105. In Embodiment 1, reverse sputtering is performed on a surface of the gate insulating film 102 by using plasma generated after introduction of an oxygen gas and an argon gas, and the exposed gate insulating film 102 is irradiated with oxygen radical or oxygen. In this manner, dust and the like on the surface are removed.

Next, the conductive film 105 is formed over the gate insulating film 102 by a sputtering method or a vacuum evaporation method. The conductive film 105 used for a wiring and an electrode can be formed using a conductive material similar to that of the gate electrode. The thickness of the conductive film used for the source electrode layer and the drain electrode layer is preferably 50 nm or more and 500 nm or less. The thickness of 500 nm or less is effective in preventing the disconnection of a semiconductor film and a wiring to be formed later. In Embodiment 1, the conductive film 105 has a three-layer structure in which a titanium film, an aluminum film including neodymium (an Al—Nd film), and a titanium film are stacked in this order.

Next, a second semiconductor film 104 serving as the protective layers is formed. The second semiconductor film 104 is desirably deposited successively without the conductive film 105 exposed to air. By the successive deposition, an interface between the conductive film and the second semiconductor film 104 serving as the protective layers can be prevented from being contaminated by air.

In Embodiment 1, the second semiconductor film 104 is formed under the following condition so as to have the resistance as high as the first oxide semiconductor layer 113 to be formed in a later step: an oxide semiconductor target with a diameter of 8 inches including In, Ga, and Zn ($In_2O_3$:$Ga_2O_3$:ZnO=1:1:1 in composition ratio) is used, the distance between the substrate and the target is 170 mm, the pressure is 0.4 Pa, the direct-current (DC) power source is 0.5 kW, and the atmosphere is argon or oxygen. Note that it is preferable to use a pulsed direct-current (DC) power source with which dust can be reduced and thickness distribution can be made uniform. The thickness of the second semiconductor film 104 is set in the range of 1 nm to 10 nm. In Embodiment 1, the second semiconductor film 104 has a thickness of 5 nm. A cross-sectional view when this step is completed is FIG. 2A.

Further, in the case where the second semiconductor film 104 cannot be formed successively after the conductive film 105 without exposure to air, a surface of the conductive film 105 which is exposed to air may be cleaned by reverse sputtering and then the second semiconductor film 104 may be formed.

Next, by using a second photomask in Embodiment 1, a resist mask 131 is formed over the second semiconductor film 104 serving as the protective layers. With the use of the resist mask 131, an unnecessary portion of the second semiconductor film 104 is removed by selective etching, whereby the first protective layer 114a and the second protective layer 114b are formed. Wet etching or dry etching is used as an etching method at this time. In Embodiment 1, the first protective layer 114a and the second protective layer 114b are formed by wet etching in which ITO-07N (KANTO CHEMICAL CO., INC.) is used.

Next, the resist mask 131, which is the same as that used for forming the first protective layer 114a and the second protective layer 114b, is used so as to remove an unnecessary portion of the conductive film 105; thus, the first electrode layer 115a and the second electrode layer 115b are formed. In Embodiment 1, dry etching is performed using a mixed gas of $SiCl_4$, $Cl_2$, and $BCl_3$ as a reaction gas to etch the conductive film in which the titanium film, the aluminum film, and the titanium film are stacked in this order, so that the first electrode layer 115a and the second electrode layer 115b are formed. Note that the etching is not limited to dry etching and wet etching may be alternatively employed. A cross-sectional view when this step is completed is FIG. 2B.

Next, an oxide semiconductor film including indium, gallium, and zinc is formed as a first semiconductor film 103 serving as the first oxide semiconductor layer 113 by a method similar to the method of forming the second semiconductor film 104. The thickness of the first semiconductor film 103 is set to 5 nm to 200 nm. The thickness of the first semiconductor film 103 in Embodiment 1 is 50 nm. A cross-sectional view when this step is completed is FIG. 2C. Note that since the first semiconductor film 103 and the first protective layer 114a and the second protective layer 114b are formed using the same composition, the interface therebetween is illustrated with a dashed line.

Note that before the formation of the first semiconductor film 103, the first protective layer 114a and the second protective layer 114b and the exposed surface of the gate insulating film 102 may be subjected to plasma treatment. An oxygen gas and an argon gas are introduced and reverse sputtering is performed, and irradiation with oxygen radical or oxygen is performed; thus, dust on the surface can be removed.

The successive deposition of the first semiconductor film 103 without the plasma-processed substrate exposed to air provides an advantageous effect of preventing sticking of dust and moisture on an interface between the first protective layer 114a and the first semiconductor film 103, an interface between the second protective layer 114b and the first semiconductor film 103, and an interface between the gate insulating film 102 and the first semiconductor film 103. The first semiconductor film 103 may be formed in the same chamber as the chamber where the reverse sputtering is performed previously, or may be formed in a different chamber from the chamber where the reverse sputtering is performed previously as long as the deposition can be performed without exposure to air.

Next, a resist mask 132 formed using a third photomask is used to remove unnecessary portions of the first semiconductor film 103 and the first protective layer 114a and the second protective layer 114b by etching. In Embodiment 1, the unnecessary portions are removed by wet etching in which ITO-07N (KANTO CHEMICAL CO., INC.) is used. Note that the etching is not limited to wet etching and dry etching may alternatively be employed. A cross-sectional view when this step is completed is FIG. 3A.

Next, the resist mask 132 is removed. After the removal of the resist mask 132, the first oxide semiconductor layer 113 may be subjected to plasma treatment. By the plasma treatment, a damage of the first oxide semiconductor layer 113 due to the etching can be repaired. The plasma treatment is preferably performed in an atmosphere of $O_2$ or $N_2O$, or preferably an atmosphere of $N_2$ including oxygen, He including oxygen, or Ar including oxygen. Alternatively, the plasma treatment may be performed in an atmosphere in which $Cl_2$ or $CF_4$ is added to the above atmosphere. Note that the plasma treatment is preferably performed with non-bias applied.

Next, thermal treatment is preferably performed at 200° C. to 600° C., typically, 300° C. to 500° C. For example, the thermal treatment is performed in a nitrogen atmosphere or air atmosphere at 350° C. for 1 hour. Through this thermal treatment, rearrangement at the atomic level occurs in the In—Ga—Zn—O-based non-single-crystal film included in the oxide semiconductor film. Since strain which inhibits carrier movement is released by this thermal treatment, the thermal treatment (including photo-annealing) here is important. There is no particular limitation on when to perform the thermal treatment as long as it is performed after the formation of the oxide semiconductor film; for example, it is performed after formation of a pixel electrode layer 128 to be performed later.

Through the above process, the thin film transistor 151 in which the first oxide semiconductor layer 113 serves as a channel formation region is completed.

Next, an interlayer insulating film 109 covering the thin film transistor 151 is formed. The interlayer insulating film 109 can be formed using a silicon nitride film, a silicon oxide film, a silicon oxynitride film, an aluminum oxide film, an aluminum nitride film, an aluminum oxynitride film, a tantalum oxide film, or the like by a sputtering method or the like.

Next, a resist mask formed using a fourth photomask in Embodiment 1 is used to etch the interlayer insulating film 109, whereby contact holes (124 and 125) reaching a wiring and the second electrode layer 115b are formed. In order to reduce the number of masks, the same resist mask is preferably used further for etching the gate insulating film 102 so as to form a contact hole 126 reaching a wiring 118. A cross-sectional view when this step is completed is FIG. 3B.

Next, after the removal of the resist mask, a transparent conductive film serving as the pixel electrode layer 128 is formed in addition to the gate electrode layer 111 and the first electrode layer 115a and the second electrode layer 115b. The transparent conductive film is formed using indium oxide ($In_2O_3$), an alloy of indium oxide and tin oxide ($In_2O_3$—$SnO_2$, abbreviated as ITO), or the like by a sputtering method, a vacuum evaporation method, or the like. Etching treatment of such a material is performed with a hydrochloric acid based solution. Instead, an alloy of indium oxide and zinc oxide ($In_2O_3$—ZnO) may be used in order to improve etching processability because a residue tends to be generated particularly in etching of ITO.

Next, a resist mask formed using a fifth photomask is used to etch the transparent conductive film, so that an unnecessary portion thereof is removed. Thus, the pixel electrode layer 128 is formed. Moreover, a storage capacitor portion can be formed by a capacitor wiring 123 and the pixel electrode layer 128 using the gate insulating film 102 and the interlayer insulating film 109 as a dielectric. With the use of the transparent conductive film left in the terminal portion, an electrode or a wiring used for connection with an FPC and a terminal electrode used for connection which functions as an input terminal of a source wiring are formed. A cross-sectional view when this step is completed is FIG. 3C.

In this manner, by the formation of the pixel electrode for the thin film transistor, a pixel portion of a display device including an n-channel TFT can be completed.

According to the method for manufacturing the semiconductor device described in Embodiment 1, a film that increases the contact resistance is not formed on the surface of the conductive film serving as the source electrode layer and the drain electrode layer. As a result, the parasitic resistance of the source region and the drain region of the thin film transistor can be suppressed without variation; thus, a thin film transistor with high electrical characteristics such as excellent on/off ratio, reduced variation, and high reliability can be provided. Further, by using the thin film transistor described in Embodiment 1 for a display device, a board for an active matrix display device with higher performance and more stable operation can be manufactured.

[Embodiment 2]

In Embodiment 2, an embodiment of the present invention is described below based on an example in which an inverter circuit is formed using two n-channel thin film transistors.

A driver circuit for driving a pixel portion of a board for an active matrix display device is formed using an inverter circuit, a capacitor, a resistor, and the like. When two n-channel TFTs are combined to form an inverter circuit, there are two types of combinations: a combination of an enhancement type transistor and a depletion type transistor (hereinafter, a circuit formed by such a combination is referred to as an "EDMOS circuit") and a combination of enhancement type TFTs (hereinafter, a circuit formed by such a combination is referred to as an "EEMOS circuit"). Note that when the threshold voltage of the n-channel TFT is positive, the n-channel TFT is defined as an enhancement type transistor, while when the threshold voltage of the n-channel TFT is negative, the n-channel TFT is defined as a depletion type transistor, and this specification follows the above definitions.

The pixel portion and the driver circuit are formed over the same substrate. In the pixel portion, on/off of voltage application to a pixel electrode is switched using enhancement type transistors arranged in a matrix. An oxide semiconductor including indium, gallium, and zinc is used for these enhancement type transistors arranged in the pixel portion. As for the electric characteristics of the enhancement type transistor, the on/off ratio is greater than or equal to $10^8$ at a gate voltage of ±20 V; therefore, leakage current can be decreased and low power consumption drive can be realized.

Figure 4A:
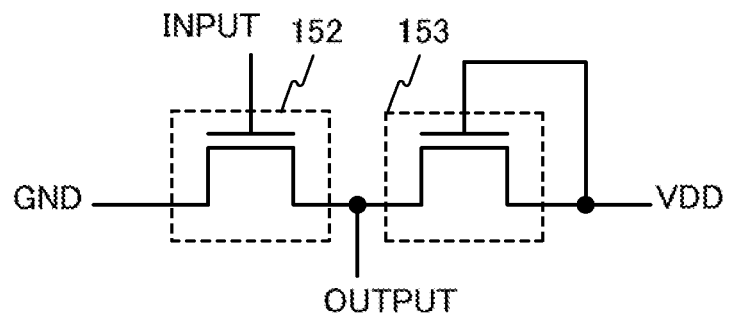
FIG. 4A is a circuit diagram.

In Embodiment 2, the inverter circuit for driving the pixel portion is formed using an EEMOS circuit. FIG. 4A illustrates an equivalent circuit of the EEMOS circuit. Moreover, FIG. 4B is a plan view of the EEMOS circuit in which a first thin film transistor 152 and a second thin film transistor 153 are enhancement type n-channel transistors, and FIG. 4C is a cross-sectional view taken along a chain line Z1-Z2 of FIG. 4B.

Figure 4B:
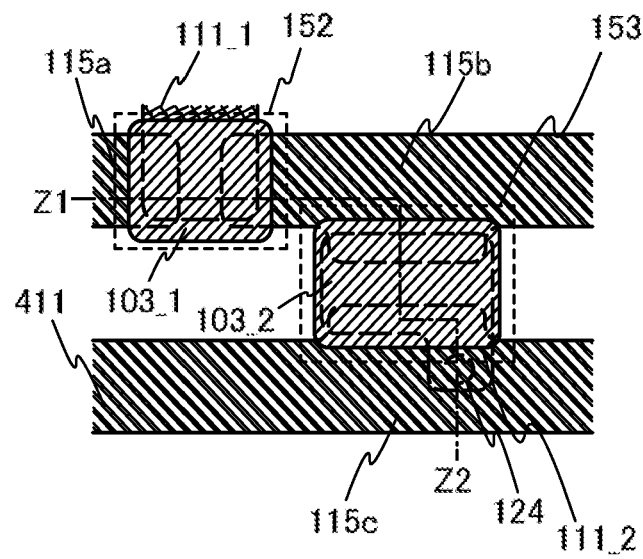
FIG. 4B is a plan view.
Figure 4C:
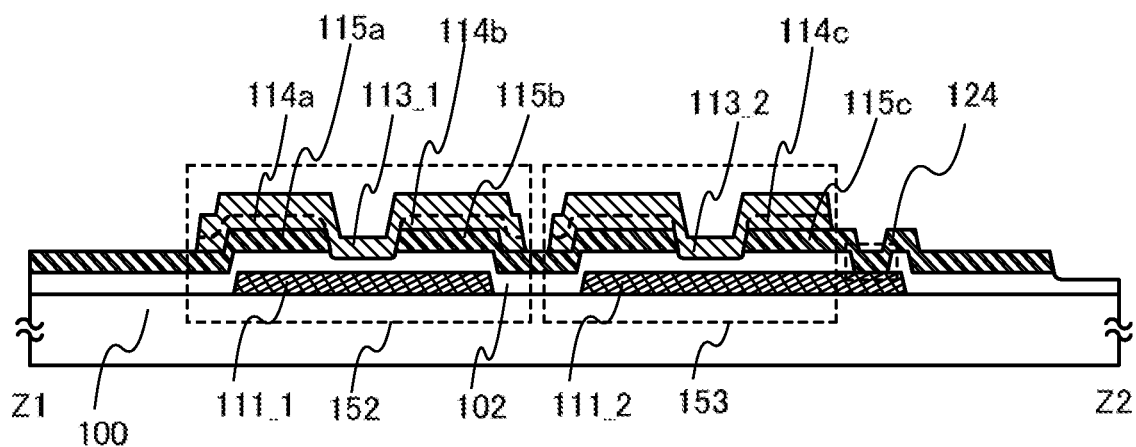
FIG. 4C is a cross-sectional view, all for describing a semiconductor device of an embodiment of the present invention.

The EEMOS circuit described in Embodiment 2 has the cross-sectional structure illustrated in FIG. 4C. A first gate electrode layer 111_1 and a second gate electrode layer 111_2 are formed over a substrate 100, and a gate insulating film 102 is formed over the first gate electrode layer 111_1 and the second gate electrode layer 111_2. A first electrode layer 115a, a second electrode layer 115b, and a third electrode layer 115c which serve as the source electrode layer and the drain electrode layer are formed over the gate insulating film 102. End portions of the first electrode layer 115a and the second electrode layer 115b overlap with the gate electrode layer 111_1 and end portions of the second electrode layer 115b and the third electrode layer 115c overlap with the gate electrode layer 111_2. Moreover, the third electrode layer 115c is directly connected to the second gate electrode layer 111_2 via a contact hole 124. A first protective layer 114a is formed over the first electrode layer 115a, a second protective layer 114b is formed over the second electrode layer 115b, and a third protective layer 114c is formed over the third electrode layer 115c. A first semiconductor layer 113_1 overlaps with the first gate electrode layer 111_1 and a first semiconductor layer 113_2 overlaps with the second gate electrode layer 111_1. The first semiconductor layer 113_1 is provided so as to be in contact with the gate insulating film 102, side face portions of the first electrode layer 115a and the second electrode layer 115b, and side face portions and top face portions of the first protective layer 114a and the second protective layer 114b. The first semiconductor layer 113_2 is provided so as to be in contact with the gate insulating film 102, side face portions of the second electrode layer 115b and the third electrode layer 115c, and side face portions and top face portions of the second protective layer 114b and the third protective layer 114c.

In other words, the gate insulating film 102 exists in the entire region including the first thin film transistor 152 and the second thin film transistor 153, and the first gate electrode layer 111_1 and the second gate electrode layer 111_2 are provided between the gate insulating film 102 and the substrate 100. The first electrode layer 115a, the second electrode layer 115b, and the third electrode layer 115c are provided in contact with the gate insulating film 102 on the side of the gate insulating film 102 which is not provided with the gate electrode layer 111_1 and the second gate electrode layer 111_2. Moreover, the first semiconductor layer 113_1 is provided over the first electrode layer 115a with the first protective layer 114a interposed therebetween, and is provided over the second electrode layer 115b with the second protective layer 114b interposed therebetween. Moreover, the first semiconductor layer 1132 is provided over the second electrode layer 115b with the second protective layer 114b interposed therebetween, and is provided over the third electrode layer 115c with the third protective layer 114c interposed therebetween. The first electrode layer 115a, the second electrode layer 115b, and the third electrode layer 115c which serve as the source electrode layer and the drain electrode layer, and a wiring are provided over the gate insulating film 102, and the third electrode layer 115c and the gate electrode layer 111_2 are directly connected to each other via the contact hole 124.

Next, a method for manufacturing a thin film transistor in the EEMOS circuit in FIGS. 4A to 4C is described with reference to FIGS. 5A to 5C.

As the substrate 100 used in Embodiment 2, a substrate similar to the substrate in Embodiment 1 can be used. Moreover, an insulating film may be formed as a base film.

The first gate electrode layer 111_1 and the second gate electrode layer 111_2 are formed by a method similar to Embodiment 1. In Embodiment 2, as the first gate electrode layer 111_1 and the second gate electrode layer 111_2, a conductive film formed by stacking a film including aluminum as a first component and a titanium film by a sputtering method is used. Next, a resist mask formed using a first photomask in Embodiment 2 is used to etch an unnecessary portion of the conductive film formed over the substrate 100, whereby a wiring and an electrode (a terminal, a capacitor wiring, and a gate wiring including the first gate electrode layer 111_1 and the second gate electrode layer 111_2) are formed. In this case, the etching is performed so that at least end portions of the first gate electrode layer 111_1 and the second gate electrode layer 111_2 are tapered.

The gate insulating film 102 of Embodiment 2 is formed by a method similar to Embodiment 1. For example, a silicon oxide film with a thickness of 100 nm is formed as the gate insulating film 102 by a plasma CVD method or a sputtering method.

Next, a resist mask formed using a second photomask in Embodiment 2 is used to form the contact hole 124 in the gate insulating film 102 so as to reach the second gate electrode layer 111_2.

A conductive film 105 used for a wiring and an electrode is formed using a conductive material similar to that in Embodiment 1. The thickness of the conductive film serving as the source electrode layer and the drain electrode layer is preferably 50 nm or more and 500 nm or less. The thickness of 500 nm or less is effective in preventing disconnection of a semiconductor film and a wiring to be formed later. Further, the conductive film 105 is formed by a sputtering method or a vacuum evaporation method. In Embodiment 1, a Ti film is used as the conductive film 105. Note that the conductive film 105 is directly connected to the second gate electrode layer 111_2 via the contact hole 124.

Next, a second semiconductor film 104 serving as the protective layers is formed successively without the formed conductive film 105 exposed to air, in a manner similar to Embodiment 1. Note that the second semiconductor film 104 is formed using an oxide semiconductor including indium, gallium, and zinc. In Embodiment 2, the second semiconductor film 104 has a thickness of 10 nm. A cross-sectional view when this step is completed is FIG. 5A.

Next, a resist mask 131 is formed using a third photomask in Embodiment 2 over the second semiconductor film 104 serving as the protective layers. In a manner similar to Embodiment 1, an unnecessary portion of the second semiconductor film 104 is removed using the resist mask 131, whereby the first protective layer 114a, the second protective layer 114b, and the third protective layer 114c are formed. Moreover, an unnecessary portion of the conductive film 105 is removed using the same resist mask 131, whereby the first electrode layer 115a, the second electrode layer 115b, and the third electrode layer 115c are formed. A cross-sectional view when this step is completed is FIG. 5B.

Next, before the formation of a first semiconductor film 103 (not shown) which serves as the first semiconductor layer 113_1 and the first semiconductor layer 1132, plasma treatment may be performed on the first protective layer 114a, the second protective layer 114b, and the third protective layer 114c, and the exposed surface of the gate insulating film 102. An oxygen gas and an argon gas are introduced to a sputtering apparatus and reverse sputtering is performed, and then irradiation with oxygen radical or oxygen is performed; thus, dust and impurities on the surfaces can be removed. Note that end portions of the gate insulating film 102, the first protective layer 114a, the second protective layer 114b, and the third protective layer 114c are slightly thinned or rounded because the surfaces thereof are shaved in the reverse sputtering process. When the end portions of the first protective layer 114a, the second protective layer 114b, and the third protective layer 114c are shaved to have small tapered angles, the first semiconductor film 103 to be stacked thereover can easily cover the tapered portions, whereby disconnection is not easily caused.

Next, while the first protective layer 114a, the second protective layer 114b, the third protective layer 114c, and the exposed gate insulating film 102 are not exposed to air, an oxide semiconductor film including indium, gallium, and zinc is deposited as the first semiconductor film 103 successively after the plasma treatment. The successive deposition provides an advantageous effect of preventing sticking of dust and moisture on an interface between the first protective layer 114a and the first semiconductor film 103, an interface between the second protective layer 114b and the first semiconductor film 103, an interface between the third protective layer 114c and the first semiconductor film 103, and an interface between the gate insulating film 102 and the first semiconductor film 103. The first semiconductor film 103 may be formed in the same chamber as the chamber where the reverse sputtering is performed previously, or may be formed in a different chamber from the chamber where the reverse sputtering is performed previously as long as the deposition can be performed without exposure to air.

In Embodiment 2, an oxide semiconductor film including indium, gallium, and zinc is formed as the first semiconductor film 103 by a method similar to Embodiment 1. The thickness of the first semiconductor film 103 is set to 5 nm to 200 nm. The thickness of the first semiconductor film 103 in Embodiment 2 is 100 nm.

Next, a resist mask 132 is formed using a fourth photomask in Embodiment 2 over the first semiconductor film 103. In a manner similar to Embodiment 1, unnecessary portions of the first semiconductor film 103 and the second semiconductor film 104 are removed by etching using the resist mask 132, whereby the first semiconductor layers 113_1 and 113_2 are formed. A cross-sectional view when this step is completed is FIG. 5C.

The first thin film transistor 152 includes the first gate electrode layer 111_1 and the first semiconductor layer 113_1 which overlaps with the first gate electrode layer 111_1 with the gate insulating film 102 interposed between the first semiconductor layer 113_1 and the first gate electrode layer 111_1, and the first electrode layer 115a is a power source line at a ground potential (a ground power source line). This power source line at a ground potential may be a power source line to which a negative voltage VDL is applied (a negative power source line).

In addition, the second thin film transistor 153 includes the second gate electrode layer 111_2 and the first semiconductor layer 1132 which overlaps with the second gate electrode layer 111_2 with the gate insulating film 102 interposed between the first semiconductor layer 1132 and the second gate electrode layer 111_2, and the third electrode layer 115c is a power source line to which a positive voltage VDD is applied (a positive power source line).

As illustrated in FIG. 4C, the second electrode layer 115b electrically connects the first thin film transistor 152 and the second thin film transistor 153 to each other. The third electrode layer 115c is directly connected to the second gate electrode layer 111_2 of the second thin film transistor 153 via the contact hole 124 formed in the gate insulating film 102. By the direct connection between the second electrode layer 115b and the second gate electrode layer 111_2, favorable contact can be achieved and contact resistance can be reduced. In comparison with the case where the second electrode layer 115b and the second gate electrode layer 111_2 are connected to each other with another conductive film, e.g., a transparent conductive film interposed therebetween, a reduction in the number of contact holes and a reduction in an occupied area by the reduction in the number of contact holes can be achieved.

The inverter circuit described in Embodiment 2 includes the thin film transistor provided with the protective layer which prevents formation of the film that increases the contact resistance between the source electrode layer and the drain electrode layer and the first semiconductor layer where a channel is formed; therefore, the variation is small and the reliability is high. Moreover, since the contact resistance is reduced by reducing the number of contact holes, the inverter circuit has excellent operating characteristics. Further, since the number of contact holes is reduced, the area occupied by the circuit can be reduced.

[Embodiment 3]

Embodiment 3 describes a thin film transistor of a semiconductor device. Specifically, a pixel portion of a display device including a top-gate thin film transistor is described.

Figure 6A:
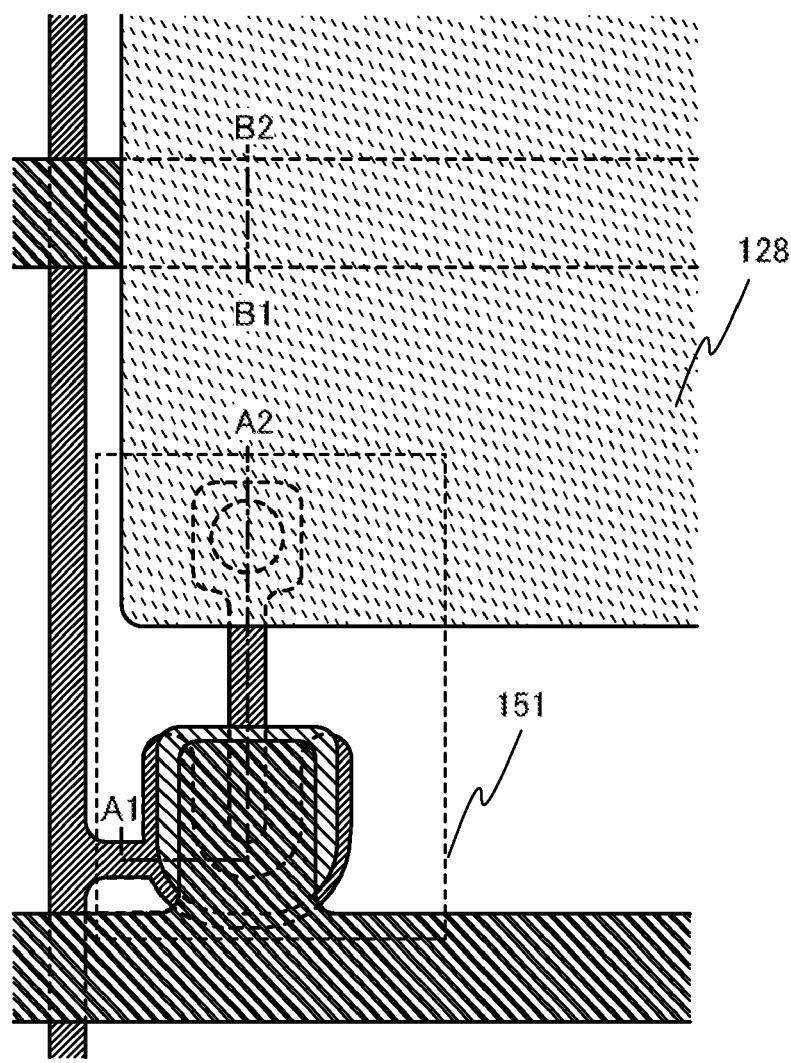
FIG. 6A is a plan view and FIG. 6B is a cross-sectional view, both for describing a semiconductor device of an embodiment of the present invention.
Figure 6B:
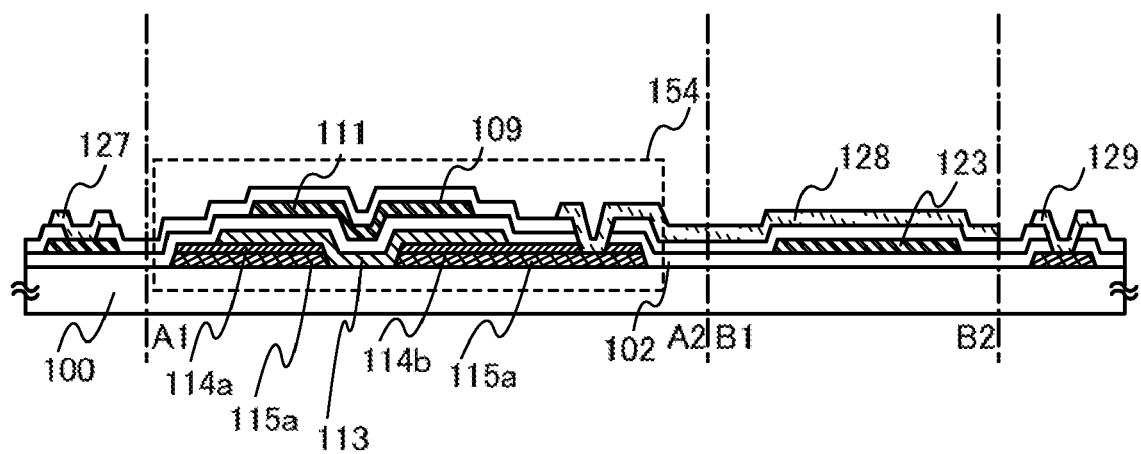

FIGS. 6A and 6B illustrate a thin film transistor of Embodiment 3. FIG. 6A is a plan view, and FIG. 6B is a cross-sectional view taken along lines A1-A2 and B1-B2 of FIG. 6A.

In a thin film transistor 154 illustrated in FIGS. 6A and 6B, a first electrode layer 115a and a second electrode layer 115b serving as a source electrode layer and a drain electrode layer are formed over a substrate 100, a first protective layer 114a is formed over the first electrode layer 115a, and a second protective layer 114b is formed over the second electrode layer 115b. A first semiconductor layer 113 is formed so as to be in contact with side face portions of the first electrode layer 115a and the second electrode layer 115b and side face portions and top face portions of the first protective layer 114a and the second protective layer 114b. A gate insulating film 102 is formed over the first semiconductor layer 113, and a gate electrode layer 111 is formed so as to overlap with end portions of the first electrode layer 115a and the second electrode layer 115b with the gate insulating film 102 interposed between the gate electrode layer 111 and the first electrode layer 115a and the second electrode layer 115b.

The first protective layer 114a is provided between and in contact with the first semiconductor layer 113 and the first electrode layer 115a, and the second protective layer 114b is provided between and in contact with the first semiconductor layer 113 and the second electrode layer 115b. Note that the first protective layer 114a and the second protective layer 114b each have a conductivity that is less than or equal to that of the first semiconductor layer 113. Moreover, a second semiconductor layer including a composition different from that of the first semiconductor layer 113 is used for the first protective layer 114a and the second protective layer 114b. Moreover, depending on the etching condition of the first semiconductor layer 113, the first protective layer 114a and the second protective layer 114b are left over the first electrode layer 115a and the second electrode layer 115b in some cases, as illustrated in FIGS. 6A and 6B.

The second semiconductor film serving as the first protective layer 114a and the second protective layer 114b is formed over a conductive film serving as the first electrode layer 115a and the second electrode layer 115b successively after the formation of the conductive film without exposure to air. Therefore, a film contaminated with dust or impurities is not formed on a surface of the conductive film.

In the thin film transistor described in Embodiment 3, the first protective layer 114a and the second protective layer 114b prevent a film that increases the contact resistance from being formed over the first electrode layer 115a and the second electrode layer 115b; therefore, the parasitic resistance of a source region and a drain region of the thin film transistor 154 can be suppressed without variation. As a result, the thin film transistor 154 exhibits transistor characteristics of small variation and high field effect mobility.

[Embodiment 4]

In Embodiment 4, an example of electronic paper is described as an embodiment of a semiconductor device of the present invention.

Figure 7:
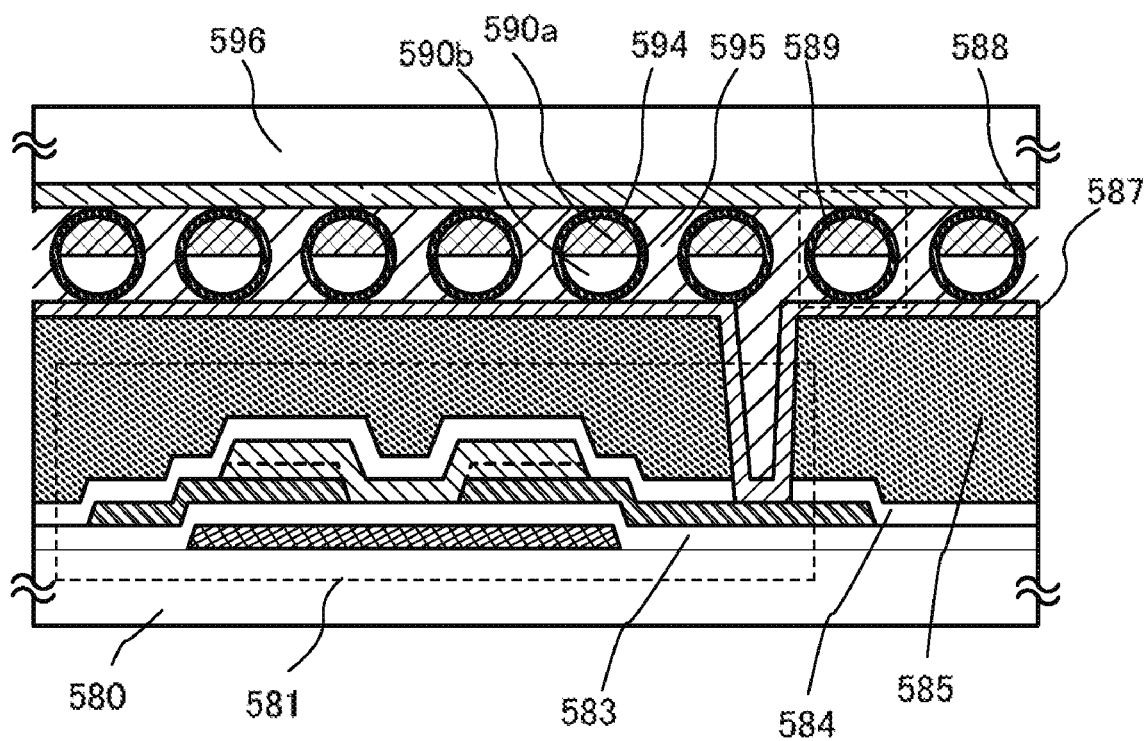
FIG. 7 is a cross-sectional view of electronic paper of an embodiment of the present invention.

FIG. 7 illustrates active matrix type electronic paper as an example of a display device according to one embodiment of the present invention. A thin film transistor 581 used in the display device can be manufactured in a manner similar to Embodiment 1, and surfaces of a source electrode layer and a drain electrode layer are protected with a second semiconductor layer; therefore, a film contaminated with dust or impurities is not formed. Therefore, the thin film transistor 581 is a thin film transistor whose parasitic resistance is suppressed without variation and operation stability is excellent.

The electronic paper in FIG. 7 is an example of a display device in which a twisting ball display system is used. The twisting ball display system refers to a method in which spherical particles each colored in black and white are arranged between a first electrode layer and a second electrode layer, and a potential difference is generated between the first electrode layer and the second electrode layer to control orientation of the spherical particles, so that display is performed.

The thin film transistor 581 formed over a substrate 580 includes a gate insulating layer 583 and an insulating layer 584, and the source electrode layer or the drain electrode layer of the thin film transistor 581 is electrically connected to a first electrode layer 587 through an opening formed in the insulating layer 584 and an insulating layer 585. Between the first electrode layer 587 and a second electrode layer 588, spherical particles 589 each having a black region 590a, a white region 590b, and a cavity 594 around the regions which is filled with liquid are provided. A space around the spherical particles 589 is filled with a filler 595 such as a resin (see FIG. 7).

As an alternative to the twisting ball, an electrophoretic element can be used. A microcapsule having a diameter of approximately 10 μm to 200 μm, in which a transparent liquid, positively charged white microparticles, and negatively charged black microparticles are encapsulated, is used. In the microcapsule that is provided between the first electrode layer and the second electrode layer, when an electric field is applied by the first electrode layer and the second electrode layer, the white microparticles and the black microparticles migrate to opposite sides to each other, so that white or black can be displayed. A display element using this principle is an electrophoretic display element, and is referred to as electronic paper in general. The electrophoretic display element has higher reflectivity than a liquid crystal display element; thus, an auxiliary light is unnecessary, less power is consumed, and a display portion can be recognized even in a dusky place. Furthermore, an image which is displayed once can be retained even when power is not supplied to the display portion. Accordingly, a displayed image can be stored even though a semiconductor device having a display function (which is also referred to as, simply, a display device or a semiconductor device provided with a display device) is distanced from an electric wave source which serves as a power supply.

Through the above steps, electronic paper incorporating the thin film transistor whose parasitic resistance is suppressed without variation and operation stability is excellent can be manufactured. Since the electronic paper described in Embodiment 4 incorporates the thin film transistor whose operation stability is excellent, the reliability is high.

Embodiment 4 can be implemented in combination with any of the structures of Embodiments in this specification as appropriate.

[Embodiment 5]

Embodiment 5 describes an example of manufacturing at least part of a driver circuit and a thin film transistor of a pixel portion, over one substrate in a display device which is an embodiment of a semiconductor device of the present invention, with reference to FIGS. 8A and 8B, FIG. 9, FIG. 10, FIG. 11, FIG. 12, and FIG. 13.

The thin film transistor disposed over one substrate is formed, for example, in a manner similar to Embodiments 1 to 3. The thin film transistor is formed to be an n-channel TFT; therefore, among driver circuits, part of a driver circuit which can be formed using an n-channel TFT is formed over the same substrate as the thin film transistor in the pixel portion.

Figure 8A:
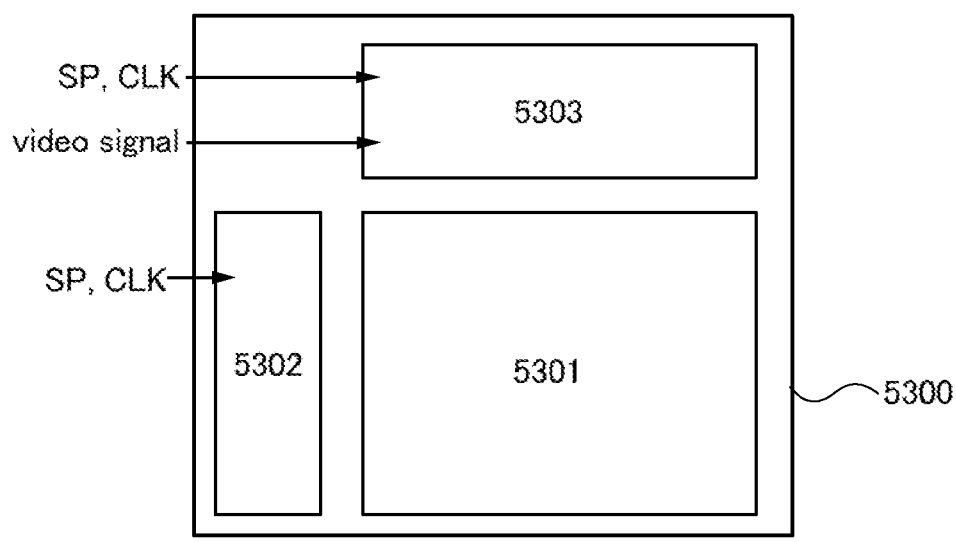
FIGS. 8A and 8B are block diagrams each describing a semiconductor device of an embodiment of the present invention.

FIG. 8A illustrates an example of a block diagram of an active matrix liquid crystal display device which is an embodiment of a semiconductor device of the present invention. The display device illustrated in FIG. 8A includes, over a substrate 5300, a pixel portion 5301 including a plurality of pixels each provided with a display element; a scan line driver circuit 5302 that selects each pixel; and a signal line driver circuit 5303 that controls a video signal input to a selected pixel.

The pixel portion 5301 is connected to the signal line driver circuit 5303 by a plurality of signal lines S1 to Sm (not shown) which extend in a column direction from the signal line driver circuit 5303, and connected to the scan line driver circuit 5302 by a plurality of scan lines G1 to Gn (not shown) which extend in a row direction from the scan line driver circuit 5302. Each pixel is connected to a signal line Sj (one of the signal lines S1 to Sm) and a scan line Gi (one of the scan lines G1 to Gn).

The thin film transistor can be formed as an n-channel TFT by a method similar to Embodiments 1 to 3, and a signal line driver circuit including an n-channel TFT is described with reference to FIG. 9.

Figure 9:
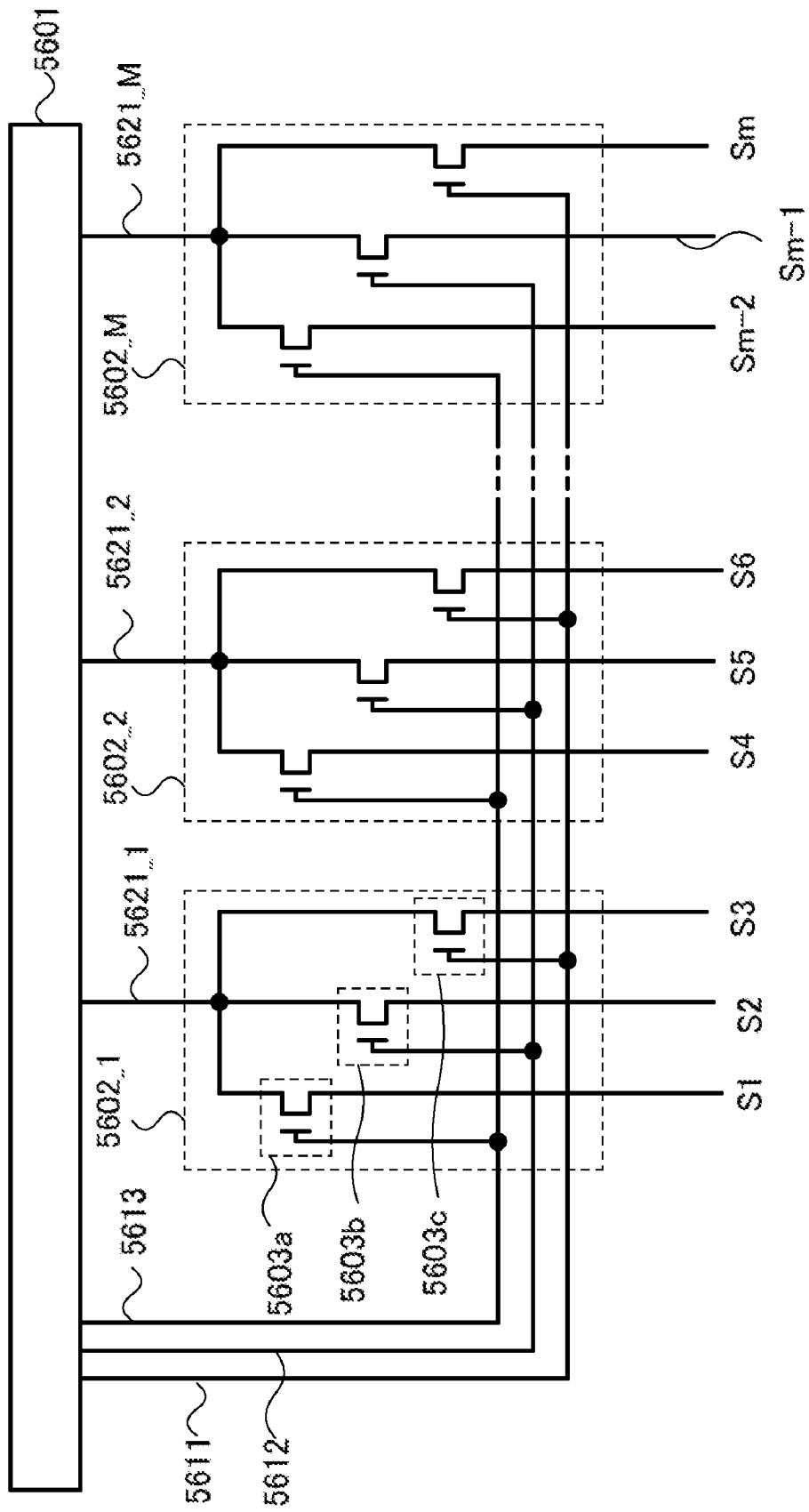
FIG. 9 illustrates a structure of a signal line driver circuit.

An example of the signal line driver circuit which is illustrated in FIG. 9 includes a driver IC 5601, switch groups 5602_1 to 5602M, a first wiring 5611, a second wiring 5612, a third wiring 5613, and wirings 5621_1 to 5621_M. Each of the switch groups 5602_1 to 5602M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621M. Each of the switch groups 5602_1 to 5602_M is connected to the first wiring 5611, the second wiring 5612, the third wiring 5613, and the wirings 5621_1 to 5621_M corresponding to the switch groups 5602_1 to 5602_M, respectively. Each of the wirings 5621_1 to 5621_M is connected to three signal lines via the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, a signal line Sj, and a signal line Sj+1 via the first thin film transistor 5603a, the second thin film transistor 5603b, and the third thin film transistor 5603c which are included in the switch group 5602_J.

A signal is input to each of the first wiring 5611, the second wiring 5612, and the third wiring 5613.

Note that the driver IC 5601 is preferably formed over a single crystal substrate. Further, the switch groups 5602_1 to 5602_M are preferably formed over the same substrate as the pixel portion. Therefore, the driver IC 5601 is connected to the switch groups 5602_1 to 5602_M preferably through an FPC or the like.

Figure 10:
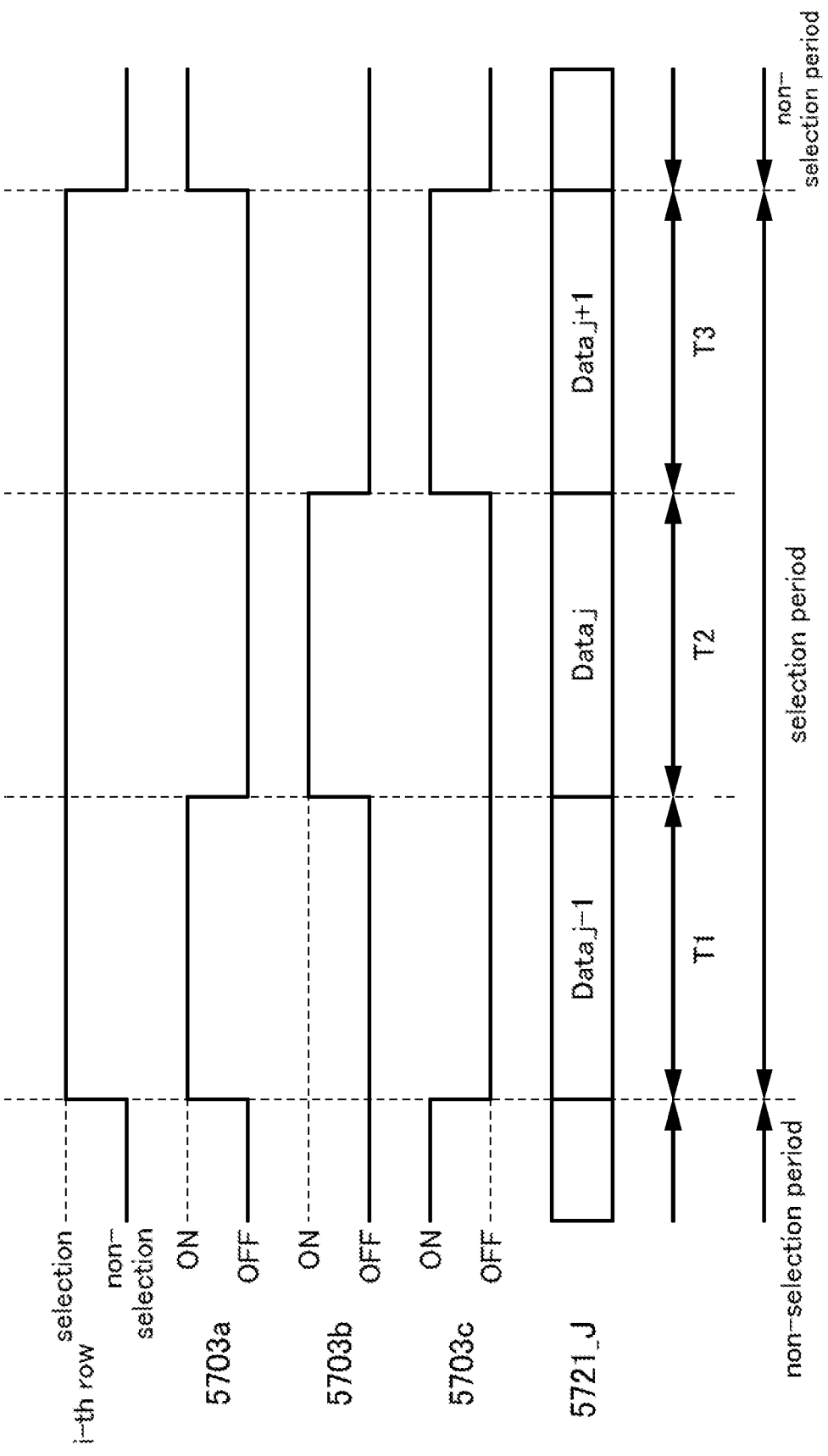
FIG. 10 is a timing chart for describing operation of the signal line driver circuit.

Next, operation of the signal line driver circuit illustrated in FIG. 9 is described with reference to a timing chart of FIG. 10. FIG. 10 is the timing chart when a scan line Gi in the i-th row is selected. A selection period of the scan line Gi of the i-th row is divided into a first sub-selection period T1, a second sub-selection period T2, and a third sub-selection period T3. In addition, the signal line driver circuit in FIG. 9 operates in a manner similar to the timing chart of FIG. 10 even when a scan line of another row is selected.

Note that the timing chart of FIG. 10 shows the case where the wiring 5621_J in the J-th column is connected to the signal line Sj−1, the signal line Sj, and the signal line Sj+1 via the first thin film transistor 5603a, the second thin film transistor 5603b, and the third thin film transistor 5603c.

The timing chart of FIG. 10 illustrates timing when the scan line Gi in the i-th row is selected, timing 5703a when the first thin film transistor 5603a is turned on/off, timing 5703b when the second thin film transistor 5603b is turned on/off, timing 5703c when the third thin film transistor 5603c is turned on/off, and a signal 5721_J input to the wiring 5621_J in the J-th column.

A video signal input to the wirings 5621_1 to 5621_M in the first sub-selection period T1, a video signal input to the wirings 5621_1 to 5621_M in the second sub-selection period T2, and a video signal input to the wirings 5621_1 to 5621_M in the third sub-selection period T3 are different from each other. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. The video signals input to the wiring 5621_J in the first sub-selection period T1, the second sub-selection period T2, and the third sub-selection period T3 are denoted by Data_j−1, Data_j, and Data_j+1, respectively.

As illustrated in FIG. 10, in the first sub-selection period T1, the first thin film transistor 5603a is on, and the second thin film transistor 5603b and the third thin film transistor 5603c are off. At this time, Data_j−1 input to the wiring 5621_J is input to the signal line Sj−1 via the first thin film transistor 5603a. In the second sub-selection period T2, the second thin film transistor 5603b is on, and the first thin film transistor 5603a and the third thin film transistor 5603c are off. At this time, Data_j input to the wiring 5621_J is input to the signal line Sj via the second thin film transistor 5603b. In the third sub-selection period T3, the third thin film transistor 5603c is on, and the first thin film transistor 5603a and the second thin film transistor 5603b are off. At this time, Data_j+1 input to the wiring 5621_J is input to the signal line Sj+1 via the third thin film transistor 5603c.

As described above, in the signal line driver circuit in FIG. 9, by dividing one gate selection period into three, video signals can be input to three signal lines from one wiring 5621 in one gate selection period. Accordingly, in the signal line driver circuit in FIG. 9, the number of connections between the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the signal line driver circuit in FIG. 9 can be improved.

Note that there is no particular limitation on the arrangement, number, driving method, and the like of the thin film transistors, as long as one gate selection period is divided into a plurality of sub-selection periods and video signals are input to a plurality of signal lines from one wiring in each of the plurality of sub-selection periods as shown in FIG. 9.

For example, when video signals are input to three or more signal lines from one wiring in three or more sub-selection periods, it is only necessary to add a thin film transistor and a wiring for controlling the thin film transistor. Note that when one selection period is divided into four or more sub-selection periods, one sub-selection period becomes short. Therefore, one selection period is preferably divided into two or three sub-selection periods.

Figure 11:
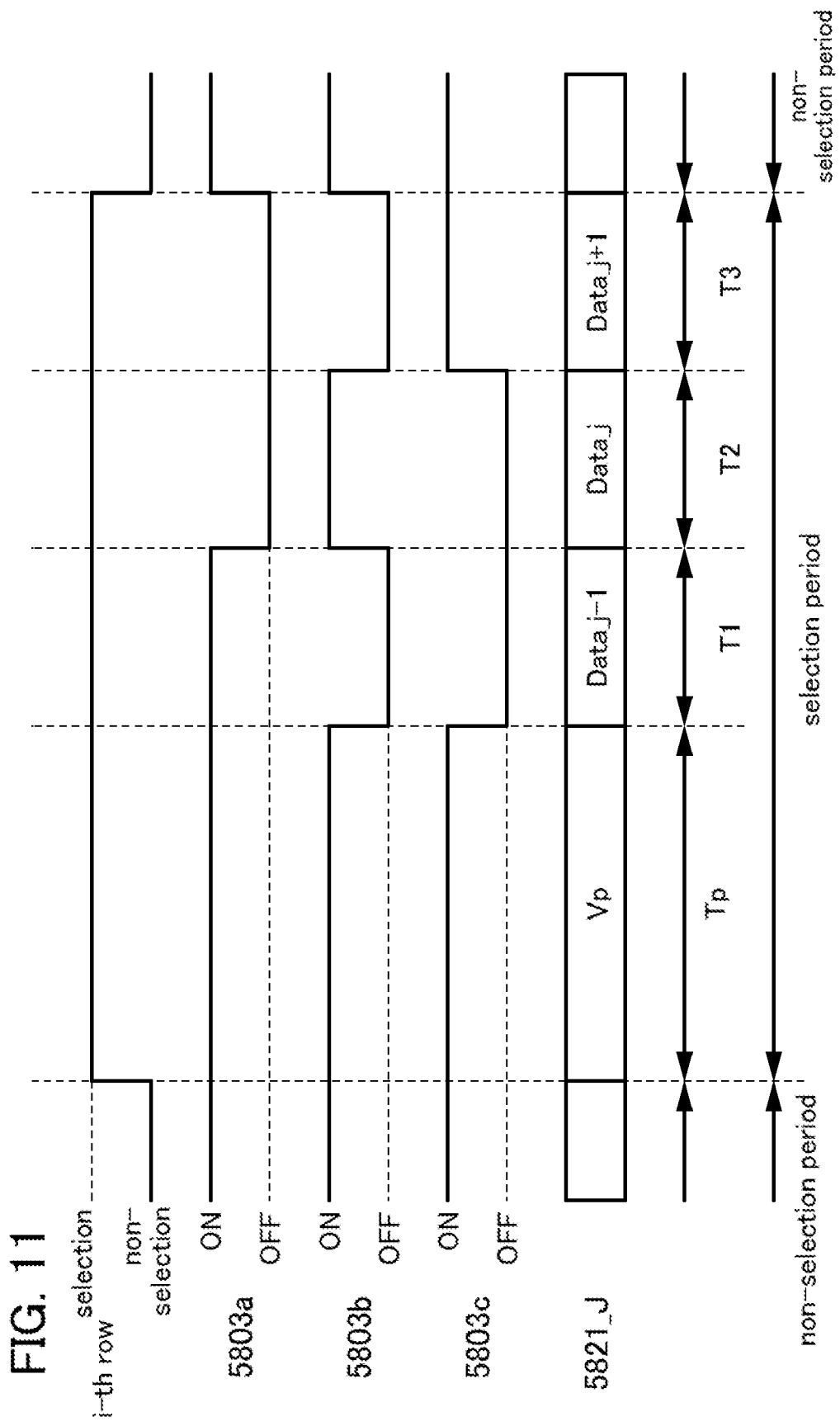
FIG. 11 is a timing chart for describing operation of the signal line driver circuit.

As another example, one selection period may be divided into a precharge period Tp, the first sub-selection period T1, the second sub-selection period T2, and the third sub-selection period T3 as illustrated in a timing chart of FIG. 11. The timing chart of FIG. 11 illustrates the timing when the scan line Gi of the i-th row is selected, timing 5803a when the first thin film transistor 5603a is turned on/off, timing 5803b when the second thin film transistor 5603b is turned on/off, timing 5803c when the third thin film transistor 5603c is turned on/off, and a signal 5821_J input to the wiring 5621_J of the J-th column. As illustrated in FIG. 11, the first thin film transistor 5603a, the second thin film transistor 5603b, and the third thin film transistor 5603c are on in the precharge period Tp. At this time, precharge voltage Vp input to the wiring 5621_J is input to the signal line Sj−1, the signal line Sj, and the signal line Sj+1 via the first thin film transistor 5603a, the second thin film transistor 5603b, and the third thin film transistor 5603c, respectively. In the first sub-selection period T1, the first thin film transistor 5603a is on, and the second thin film transistor 5603b and the third thin film transistor 5603c are off. At this time, Data_j−1 input to the wiring 5621_J is input to the signal line Sj−1 via the first thin film transistor 5603a. In the second sub-selection period T2, the second thin film transistor 5603b is on, and the first thin film transistor 5603a and the third thin film transistor 5603c are off. At this time, Data_j input to the wiring 5621_J is input to the signal line Sj via the second thin film transistor 5603b. In the third sub-selection period T3, the third thin film transistor 5603c is on, and the first thin film transistor 5603a and the second thin film transistor 5603b are off. At this time, Data_j+1 input to the wiring 5621_J is input to the signal line Sj+1 via the third thin film transistor 5603c.

As described above, in the signal line driver circuit in FIG. 9 to which the timing chart in FIG. 11 is applied, the video signal can be written to the pixel at high speed because the signal line can be precharged by providing a precharge selection period before a sub-selection period. Note that portions in FIG. 11 which are similar to those of FIG. 10 are denoted by common reference numerals and the detailed description of the same portions and portions which have similar functions is omitted.

Moreover, an example of the scan line driver circuit is described. The scan line driver circuit includes a shift register and a buffer. A level shifter may be included in some cases. In the scan line driver circuit, when a clock signal (CLK) and a start pulse signal (SP) are input to the shift register, a selection signal is generated. The generated selection signal is buffered and amplified by the buffer, and the resulting signal is supplied to a corresponding scan line. Gate electrode layers of transistors in pixels of one line are connected to the scan line. Since the transistors in the pixels of one line have to be turned on all at once, a buffer which can supply a large amount of current is used.

One mode of a shift register which is used for part of the scan line driver circuit is described with reference to FIG. 12 and FIG. 13.

Figure 12:
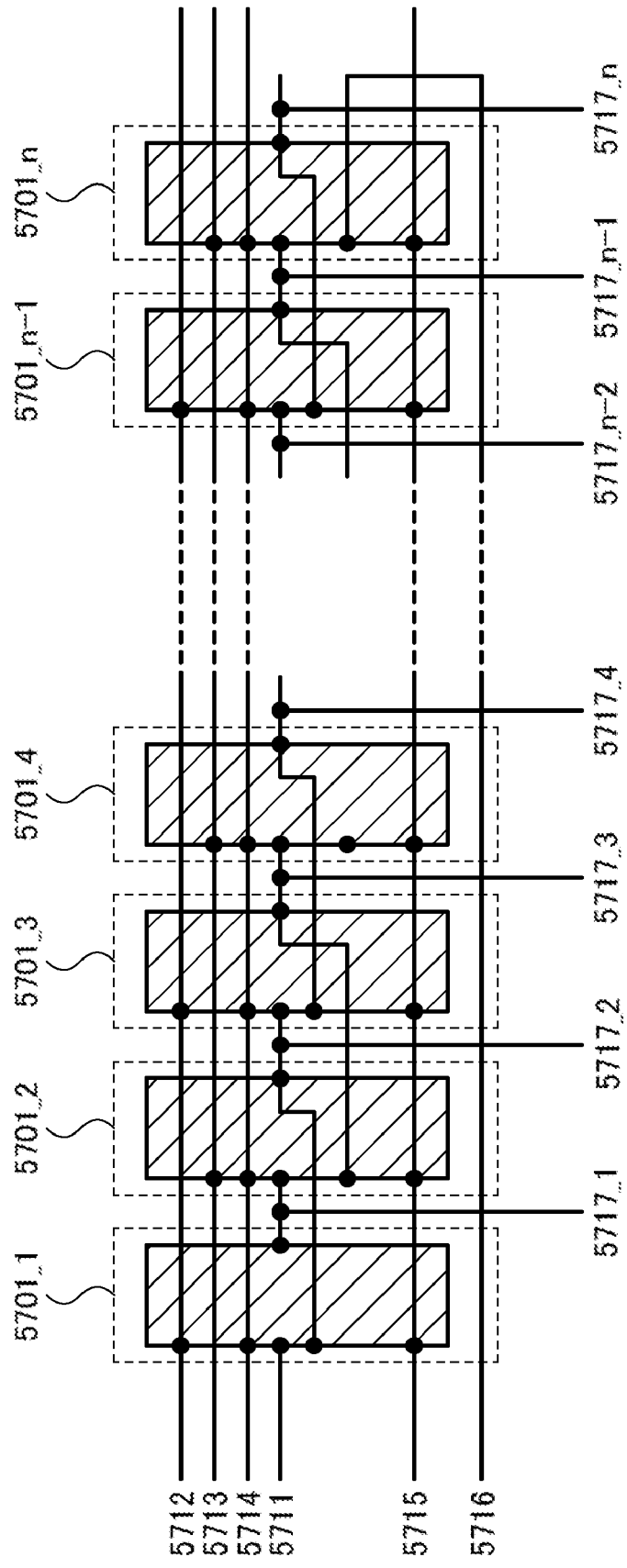
FIG. 12 illustrates a configuration of a shift register.

FIG. 12 illustrates a circuit configuration of the shift register. The shift register illustrated in FIG. 12 includes a plurality of flip-flops: flip-flops 5701_1 to 5701_n. Further, the shift register operates by the input of a first clock signal, a second clock signal, a start pulse signal, and a reset signal.

Connection relations of the shift register in FIG. 12 are described. In a flip-flop 5701_i (any one of the flip-flops 5701_1 to 5701_n) of an i-th stage in the shift register of FIG. 12, a first wiring 5501 illustrated in FIG. 13 is connected to a seventh wiring 5717_i−1; a second wiring 5502 illustrated in FIG. 13 is connected to a seventh wiring 5717_i+1; a third wiring 5503 illustrated in FIG. 13 is connected to a seventh wiring 5717_i; and a sixth wiring 5506 illustrated in FIG. 13 is connected to a fifth wiring 5715.

Figure 13:
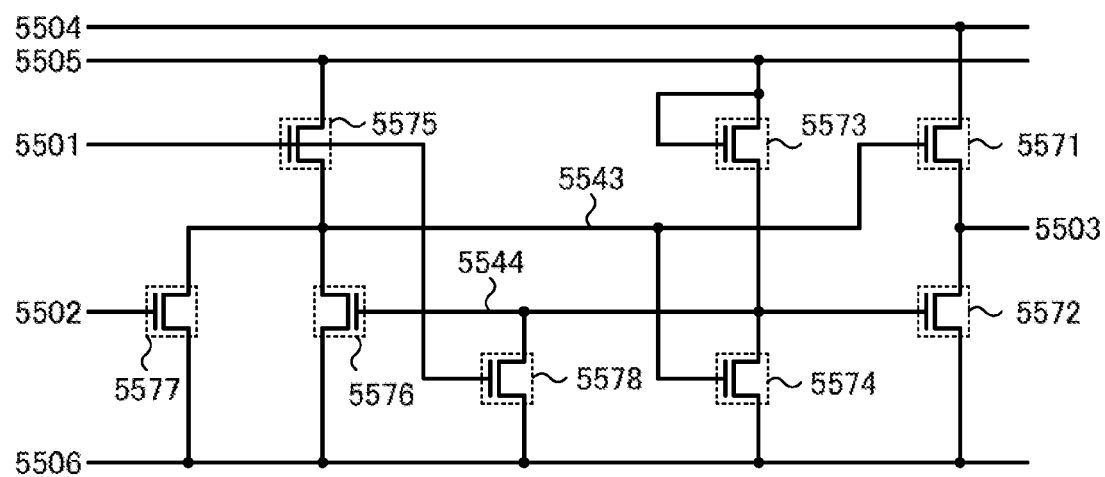
FIG. 13 illustrates a connecting structure of flip-flops illustrated in FIG. 11.

Further, a fourth wiring 5504 shown in FIG. 13 is connected to a second wiring 5712 in flip-flops of odd-numbered stages, and is connected to a third wiring 5713 in flip-flops of even-numbered stages. A fifth wiring 5505 shown in FIG. 13 is connected to a fourth wiring 5714.

Note that the first wiring 5501 shown in FIG. 13 of the flip-flop 5701_1 of a first stage is connected to a first wiring 5711, and the second wiring 5502 shown in FIG. 13 of the flip-flop 5701_n of an n-th stage is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, FIG. 13 illustrates the details of the flip-flop illustrated in FIG. 12. A flip-flop illustrated in FIG. 13 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

Next, connections of the flip-flop illustrated in FIG. 13 are described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505. A second electrode of the third thin film transistor 5573 is connected to a gate electrode layer of the second thin film transistor 5572. A gate electrode layer of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode layer of the second thin film transistor 5572. A gate electrode layer of the fourth thin film transistor 5574 is connected to a gate electrode layer of the first thin film transistor 5571.

A first electrode of the fifth thin film transistor 5575 is connected to the fifth wiring 5505. A second electrode of the fifth thin film transistor 5575 is connected to the gate electrode layer of the first thin film transistor 5571. A gate electrode layer of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode layer of the first thin film transistor 5571. A gate electrode layer of the sixth thin film transistor 5576 is connected to the gate electrode layer of the second thin film transistor 5572.

A first electrode of the seventh thin film transistor 5577 is connected to the sixth wiring 5506. A second electrode of the seventh thin film transistor 5577 is connected to the gate electrode layer of the first thin film transistor 5571. A gate electrode layer of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode layer of the second thin film transistor 5572. A gate electrode layer of the eighth thin film transistor 5578 is connected to the first wiring 5501.

Note that the point at which the gate electrode layer of the first thin film transistor 5571, the gate electrode layer of the fourth thin film transistor 5574, the second electrode of the fifth thin film transistor 5575, the second electrode of the sixth thin film transistor 5576, and the second electrode of the seventh thin film transistor 5577 are connected to each other is referred to as a node 5543. The point at which the gate electrode layer of the second thin film transistor 5572, the second electrode of the third thin film transistor 5573, the second electrode of the fourth thin film transistor 5574, the gate electrode layer of the sixth thin film transistor 5576, and the second electrode of the eighth thin film transistor 5578 are connected to each other is referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

Alternatively, the signal line driver circuit and the scan line driver circuit can be manufactured using only n-channel TFTs, which can be manufactured by a method similar to Embodiments 1 to 3. Since the n-channel TFTs which can be formed by a method similar to Embodiments 1 to 3 have high mobility, the driving frequency of the driver circuits can be increased. For example, the scan line driver circuit including the n-channel TFTs which can be formed by a method similar to Embodiments 1 to 3 can operate at high speed; therefore, it is possible to increase the frame frequency or to achieve insertion of a black screen, for example.

In addition, when the channel width of the transistor in the scan line driver circuit is increased or a plurality of scan line driver circuits is provided, for example, much higher frame frequency can be realized. When a plurality of scan line driver circuits is provided, a scan line driver circuit for driving scan lines of even-numbered rows is provided on one side and a scan line driver circuit for driving scan lines of odd-numbered rows is provided on the opposite side; thus, an increase in frame frequency can be realized. Furthermore, the use of the plurality of scan line driver circuits for output of signals to the same scan line is advantageous in increasing the size of a display device.

In the case of manufacturing an active matrix type light-emitting display device, which is an example of a semiconductor device according to one embodiment of the present invention, a plurality of scan line driver circuits is preferably arranged because a plurality of thin film transistors is arranged in at least one pixel. An example of a block diagram of an active matrix light-emitting display device is illustrated in FIG. 8B.

Figure 8B:
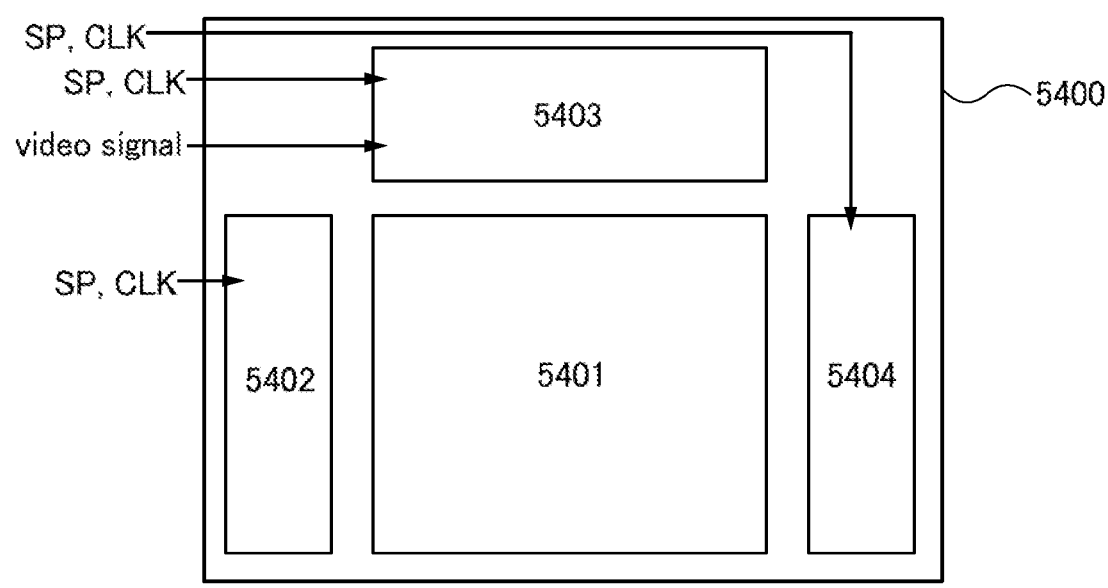

The light-emitting display device illustrated in FIG. 8B includes, over a substrate 5400, a pixel portion 5401 having a plurality of pixels each provided with a display element, a first scan line driver circuit 5402 and a second scan line driver circuit 5404 that select a pixel, and a signal line driver circuit 5403 that controls the input of a video signal to the selected pixel.

In the case of inputting a digital video signal to the pixel of the light-emitting display device of FIG. 8B, the pixel is put in a light-emitting state or non-light-emitting state by switching on/off of the transistor. Thus, grayscale can be displayed using an area ratio grayscale method or a time ratio grayscale method. An area ratio grayscale method refers to a driving method by which one pixel is divided into a plurality of subpixels and the respective subpixels are driven separately based on video signals so that grayscale display is performed. Further, a time ratio grayscale method refers to a driving method by which a period during which a pixel is in a light-emitting state is controlled so that grayscale display is performed.

Since the response time of light-emitting elements is shorter than that of liquid crystal elements or the like, the light-emitting elements are suitable for a time ratio grayscale method. Specifically, in the case of performing display with a time ratio grayscale method, one frame period is divided into a plurality of subframe periods. Then, in accordance with video signals, the light-emitting element in the pixel is set in a light-emitting state or a non-light-emitting state in each subframe period. By dividing one frame period into a plurality of subframe periods, the total length of time, in which a pixel actually emits light in one frame period, can be controlled by video signals so that grayscale display is performed.

Note that in the example of the light-emitting display device shown in FIG. 8B, when two switching TFTs are arranged in one pixel, the first scan line driver circuit 5402 generates a signal which is input to a first scan line serving as a gate wiring of one of the two switching TFTs, and the second scan line driver circuit 5404 generates a signal which is input to a second scan line serving as a gate wiring of the other of the two switching TFTs; however, one scan line driver circuit may generate both the signal which is input to the first scan line and the signal which is input to the second scan line. In addition, for example, there is a possibility that a plurality of scan lines used for controlling the operation of the switching element is provided in each pixel, depending on the number of the switching TFTs included in one pixel. In this case, one scan line driver circuit may generate all signals that are input to the plurality of scan lines, or a plurality of scan line driver circuits may generate signals that are input to the plurality of scan lines.

Moreover, in the light-emitting display device, part of a driver circuit that can include n-channel TFTs can be formed over the same substrate as the thin film transistors of the pixel portion. Moreover, the signal line driver circuit and the scan line driver circuit can be manufactured using only the n-channel TFTs which can be formed by a method similar to Embodiments 1 to 3.

Moreover, the above-described driver circuit can be used for electronic paper that drives electronic ink using an element electrically connected to a switching element, without being limited to applications to a liquid crystal display device or a light-emitting display device. The electronic paper is also referred to as an electrophoretic display device (an electrophoretic display) and is advantageous in that it has the same level of readability as plain paper and it has lower power consumption and smaller thickness and weight than other display devices.

A variety of modes of electrophoretic displays can be considered. The electrophoresis display is a device in which a plurality of microcapsules each including first particles having a positive charge and second particles having a negative charge are dispersed in a solvent or a solute, and an electrical field is applied to the microcapsules so that the particles in the microcapsules move in opposite directions from each other, and only a color of the particles gathered on one side is displayed. Note that the first particles or the second particles include a dye, and do not move when there is no electric field. Moreover, the first particles have a color which is different from that of the second particles (the particles may also be colorless).

Thus, the electrophoretic display utilizes a so-called dielectrophoretic effect, in which a substance with high dielectric constant moves to a region with high electric field. The electrophoretic display does not require a polarizing plate and an opposite substrate, which are necessary for a liquid crystal display device, so that the thickness and weight thereof are about half.

That which the microcapsules are dispersed in a solvent is called electronic ink, and this electronic ink can be printed on a surface of glass, plastic, fabric, paper, or the like. Color display is also possible with the use of a color filter or particles including a coloring matter.

In addition, when a plurality of the above microcapsules is arranged as appropriate over an active matrix substrate so as to be interposed between two electrodes, an active matrix display device can be completed, and display can be performed by application of an electric field to the microcapsules. For example, the active matrix substrate obtained using the thin film transistors which can be formed by a method similar to Embodiments 1 to 3 can be used.

Note that the first particles and the second particles in the microcapsules may each be formed using a single material selected from a conductive material, an insulating material, a semiconductor material, a magnetic material, a liquid crystal material, a ferroelectric material, an electroluminescent material, an electrochromic material, or a magnetophoretic material or formed using a composite material of any of these.

Since the driver circuit of the display device described in Embodiment 5 includes the thin film transistor in which the source electrode layer and the drain electrode layer are protected with the second semiconductor layer, the parasitic resistance of the source region and the drain region can be suppressed without variation. As a result, a board for an active matrix display device whose performance has been enhanced and operation stability has been achieved can be completed.

Embodiment 5 can be implemented in combination with any of the structures of Embodiments in this specification as appropriate.

[Embodiment 6]

In Embodiment 6, a thin film transistor formed in a manner similar to Embodiments 1 to 3 can be used for manufacture of a pixel portion or further for manufacture of a driver circuit so as to provide a semiconductor device (also referred to as a display device) having a display function. Further, part or whole of a driver circuit can be formed over the same substrate as a pixel portion, using a thin film transistor formed in a manner similar to Embodiments 1 to 3, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes, in its category, an inorganic electroluminescent (EL) element, an organic EL element, and the like. Further, a display medium whose contrast is changed by an electric effect, such as an electronic ink, can be used.

In addition, a display device includes a panel in which the display element is sealed, and a module in which an IC or the like including a controller is mounted on the panel. One embodiment of the present invention relates to one mode of an element substrate before the display element is completed in a process for manufacturing the display device, and the element substrate is provided with a means for supplying current to the display element. Specifically, the element substrate may be in a state provided with only a pixel electrode of the display element, a state after a conductive film to be a pixel electrode is formed and before the conductive film is etched to form the pixel electrode, or any of other states.

A display device in this specification means an image display device, a display device, or a light source (including a lighting apparatus). Further, the category of the display device includes a module provided with a connector such as a flexible printed circuit (FPC), a tape automated bonding (TAB) tape, or a tape carrier package (TCP); a module provided with a printed wiring board at an end of a TAB tape or a TCP; and a module having an integrated circuit (IC) which is directly mounted on a display element by a chip-on-glass (COG) method.

In Embodiment 6, the appearance and a cross section of a liquid crystal display panel, which is one embodiment of a semiconductor device of the present invention, are described with reference to FIGS. 14A1, 14A2, and 14B. Each of FIGS. 14A1 and 14A2 is a top view of a panel in which thin film transistors 4010 and 4011 which are formed in a manner similar to Embodiment 1, and a liquid crystal element 4013 are sealed between a first substrate 4001 and a second substrate 4006 with a sealant 4005. FIG. 14B is a cross-sectional view taken along line M-N of FIGS. 14A1 and 14A2.

The sealant 4005 is provided so as to surround a pixel portion 4002 and a scan line driver circuit 4004 that are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 14A1 illustrates an example of mounting the signal line driver circuit 4003 by a COG method, and FIG. 14A2 illustrates an example of mounting the signal line driver circuit 4003 by a TAB method.

The pixel portion 4002 and the scan line driver circuit 4004 formed over the first substrate 4001 each include a plurality of thin film transistors, and the thin film transistor 4010 included in the pixel portion 4002 and the thin film transistor 4011 included in the scan line driver circuit 4004 are illustrated as an example in FIG. 14B. Insulating layers 4020 and 4021 are provided over the thin film transistors 4010 and 4011.

As each of the thin film transistors 4010 and 4011, the thin film transistor described in Embodiment 1 can be used, for example. In Embodiment 6, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be each formed by using glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Further, a sheet in which aluminum foil is sandwiched by PVF films or polyester films can also be used.

A columnar spacer denoted by reference numeral 4035 is obtained by selective etching of an insulating film and is provided in order to control the distance (a cell gap) between the pixel electrode layer 4030 and the counter electrode layer 4031. Note that a spherical spacer may be used. The counter electrode layer 4031 is electrically connected to a common potential line provided over the same substrate as the thin film transistor 4010. Note that the conductive particles are contained in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is generated only within a narrow range of temperatures, a liquid crystal composition including a chiral agent at 5 wt % or more is used for the liquid crystal layer 4008 in order to improve the temperature range. The liquid crystal composition which includes a liquid crystal showing a blue phase and a chiral agent has a small response time of 10 μs to 100 μs, has optical isotropy, which makes the alignment process unnecessary, and has small viewing angle dependence.

Note that Embodiment 6 describes an example of a transmissive liquid crystal display device; however, one embodiment of the present invention can be applied to a reflective liquid crystal display device or a semi-transmissive liquid crystal display device.

In Embodiment 6, an example of the liquid crystal display device is described in which a polarizing plate is provided on the outer side of the substrate (on the viewer side) and a coloring layer and an electrode layer used for a display element are provided in this order on the inner side of the substrate; however, the polarizing plate may be provided on the inner side of the substrate. The stack structure of the polarizing plate and the coloring layer is not limited to that described in Embodiment 7 and may be set as appropriate depending on materials of the polarizing plate and the coloring layer or conditions of manufacturing steps. Furthermore, a light-blocking film serving as a black matrix may be provided.

In Embodiment 6, in order to reduce surface unevenness of the thin film transistor and to improve reliability of the thin film transistor, the thin film transistor obtained by Embodiment 1 is covered with the insulating layers (the insulating layer 4020 and the insulating layer 4021) functioning as a protective film or a planarizing insulating film. Note that the protective film is provided to prevent entry of impurities floating in air, such as an organic substance, a metal substance, or moisture, and is preferably a dense film. The protective film may be formed by a sputtering method to be a single-layer film or a stack including any of a silicon oxide film, a silicon nitride film, a silicon oxynitride film, a silicon nitride oxide film, an aluminum oxide film, an aluminum nitride film, an aluminum oxynitride film, or an aluminum nitride oxide film. Although an example in which the protective film is formed by a sputtering method is described in Embodiment 6, the present invention is not limited to this method and any of a variety of methods may be employed.

As a first layer of the insulating layer 4020 with a stacked structure serving as the protective film, a silicon oxide film is formed by a sputtering method in Embodiment 6. The use of the silicon oxide film as the protective film has an advantageous effect of preventing a hillock of an aluminum film used for the source and drain electrode layers.

Moreover, a silicon nitride film is formed by a sputtering method as a second layer of the insulating layer 4020. The use of the silicon nitride film as the protective film can prevent mobile ions such as sodium ions from entering a semiconductor region, thereby suppressing variations in electrical characteristics of the TFT.

Further, after the protective film is formed, an oxide semiconductor layer including indium, gallium, and zinc may be annealed (at 300° C. to 400° C.).

The insulating layer 4021 is formed as the planarizing insulating film. The insulating layer 4021 can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. A siloxane-based resin may include as a substituent at least one of fluorine, an alkyl group, and an aryl group, as well as hydrogen. Note that the insulating layer 4021 may be formed by stacking a plurality of insulating films formed using these materials.

Note that a siloxane-based resin is a resin formed using a siloxane-based material as a starting material and having the bond of Si—O—Si. A siloxane-based resin may include as a substituent at least one of fluorine, an alkyl group, and an aryl group, as well as hydrogen.

There is no particular limitation on the method for forming the insulating layer 4021, and the insulating layer 4021 can be formed, depending on the material, by a sputtering method, an SOG method, a spin coating method, a dipping method, a spray coating method, a droplet discharge method (e.g., an inkjet method, screen printing, offset printing, or the like), a doctor knife, a roll coater, a curtain coater, a knife coater, or the like. In the case of forming the insulating layer 4021 using a material solution, the oxide semiconductor layer including indium, gallium, and zinc may be annealed (300° C. to 400° C.) at the same time as a baking step. The baking step of the insulating layer 4021 also serves as annealing of the oxide semiconductor layer including indium, gallium and zinc, whereby a semiconductor device can be manufactured efficiently.

The pixel electrode layer 4030 and the counter electrode layer 4031 can be each formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

Alternatively, a conductive composition including a conductive high molecule (also referred to as a conductive polymer) can be used for the pixel electrode layer 4030 and the counter electrode layer 4031. The pixel electrode layer formed using such a conductive composition preferably has a sheet resistance of 10000 or less ohms per square and a light transmittance of 70% or higher at a wavelength of 550 nm. Further, the resistivity of the conductive high molecule contained in the conductive composition is preferably less than or equal to 0.1 Ω·cm.

As the conductive high molecule, a so-called "π electron conjugated conductive high molecule" can be used. As examples thereof, polyaniline or a derivative thereof, polypyrrole or a derivative thereof, polythiophene or a derivative thereof, a copolymer of two or more kinds of them, and the like can be given.

In addition, a variety of signals and potentials are supplied to the signal line driver circuit 4003 that is formed separately, and the scan line driver circuit 4004 or the pixel portion 4002 from an FPC 4018.

In Embodiment 6, a connection terminal electrode 4015 is formed using the same conductive film as the pixel electrode layer 4030 included in the liquid crystal element 4013, and a terminal electrode 4016 is formed using the same conductive film as source and drain electrode layers of the thin film transistors 4010 and 4011.

The connection terminal electrode 4015 is electrically connected to a terminal included in the FPC 4018 through an anisotropic conductive film 4019.

FIGS. 14A1, 14A2, and 14B illustrate an example in which the signal line driver circuit 4003 is separately formed and mounted on the first substrate 4001; however, Embodiment 6 is not limited to this structure. The scan line driver circuit may be formed separately and then mounted, or only part of the signal line driver circuit or part of the scan line driver circuit may be formed separately and then mounted.

Figure 15:
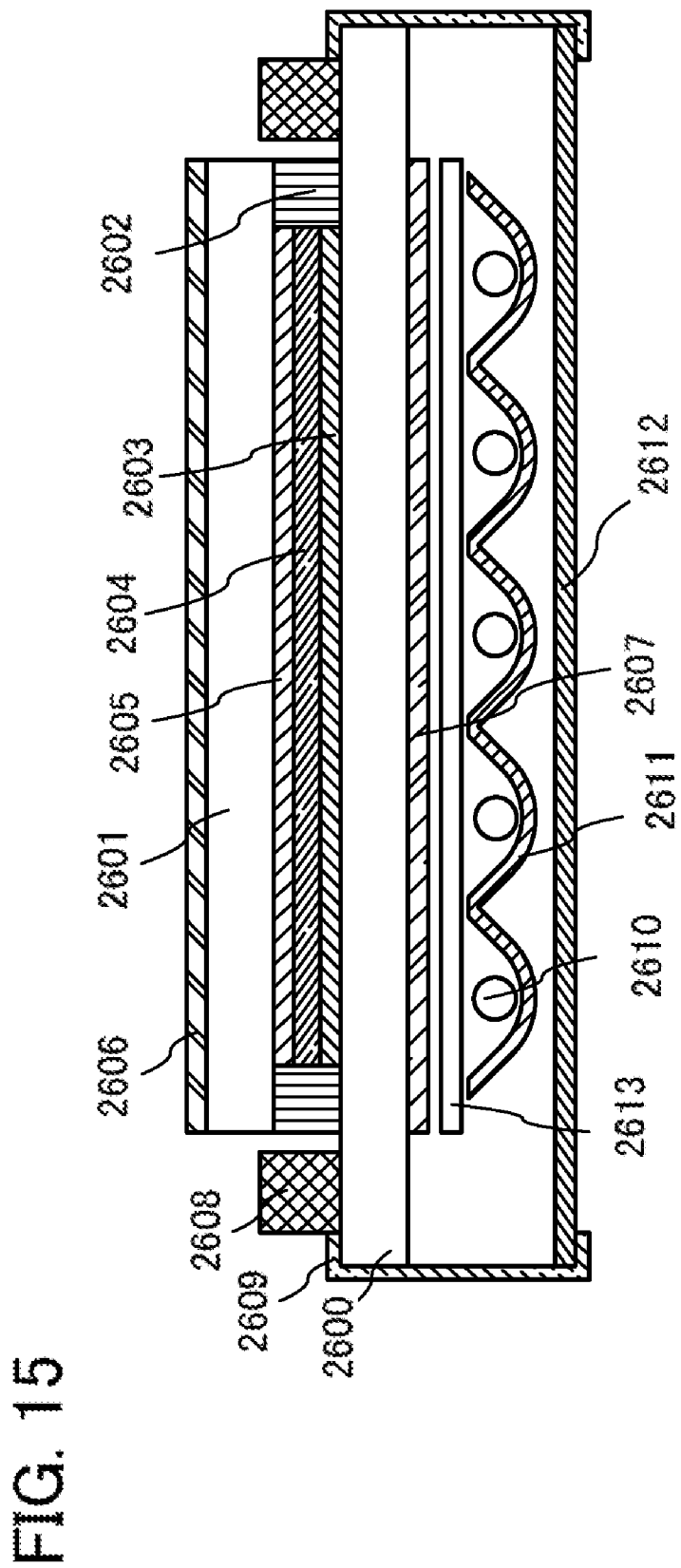
FIG. 15 is a cross-sectional view for describing a semiconductor device of an embodiment of the present invention.

FIG. 15 illustrates an example in which a liquid crystal display module is formed as a semiconductor device using a TFT substrate 2600 manufactured according to one embodiment of the present invention.

FIG. 15 shows an example of a liquid crystal display module, in which the TFT substrate 2600 and an opposite substrate 2601 are fixed to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffuser plate 2613 are provided outside the TFT substrate 2600 and the opposite substrate 2601. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit and a power source circuit. The polarizing plate and the liquid crystal layer may be stacked with a retardation film interposed therebetween.

The liquid crystal display module can use any of a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (AntiFerroelectric Liquid Crystal) mode, and the like.

Through the above steps, a display device including the thin film transistor whose operation stability is excellent can be manufactured. Since the liquid crystal display device of Embodiment 6 includes the thin film transistor whose operation stability is excellent, the reliability of the liquid crystal display device is high.

Embodiment 6 can be implemented in combination with any of the structures of Embodiments in this specification as appropriate.

[Embodiment 7]

In Embodiment 7, a light-emitting display device as an embodiment of the semiconductor device of the present invention is described. As a display element included in a display device, a light-emitting element utilizing electroluminescence is described here. Light emitting elements utilizing electroluminescence are classified according to whether a light emitting material is an organic compound or an inorganic compound. In general, the former is referred to as an organic EL element, the latter as an inorganic EL element.

In an organic EL element, by application of voltage to a light-emitting element, electrons and holes are separately injected from a pair of electrodes into a layer including a light-emitting organic compound, so that current flows. Then, recombination of these carriers (the electrons and holes) makes the light-emitting organic compound form an excited state and emit light when it returns from the excited state to a ground state. From such a mechanism, such a light emitting element is referred to as a current excitation type light emitting element.

Inorganic EL elements are classified in a dispersion type inorganic EL element and a thin-film inorganic EL element. A dispersion type inorganic EL element includes a light-emitting layer in which particles of a light-emitting material are dispersed in a binder, and light emission mechanism thereof is donor-acceptor recombination light emission, in which a donor level and an acceptor level are utilized. In a thin-film inorganic EL element, a light-emitting layer is sandwiched between dielectric layers, and the dielectric layers are sandwiched between electrodes. Light emission mechanism of the thin-film inorganic EL element is local light emission, in which inner-shell electron transition of a metal ion is utilized. Here, an organic EL element is used as the light-emitting element in the description.

Figure 16:
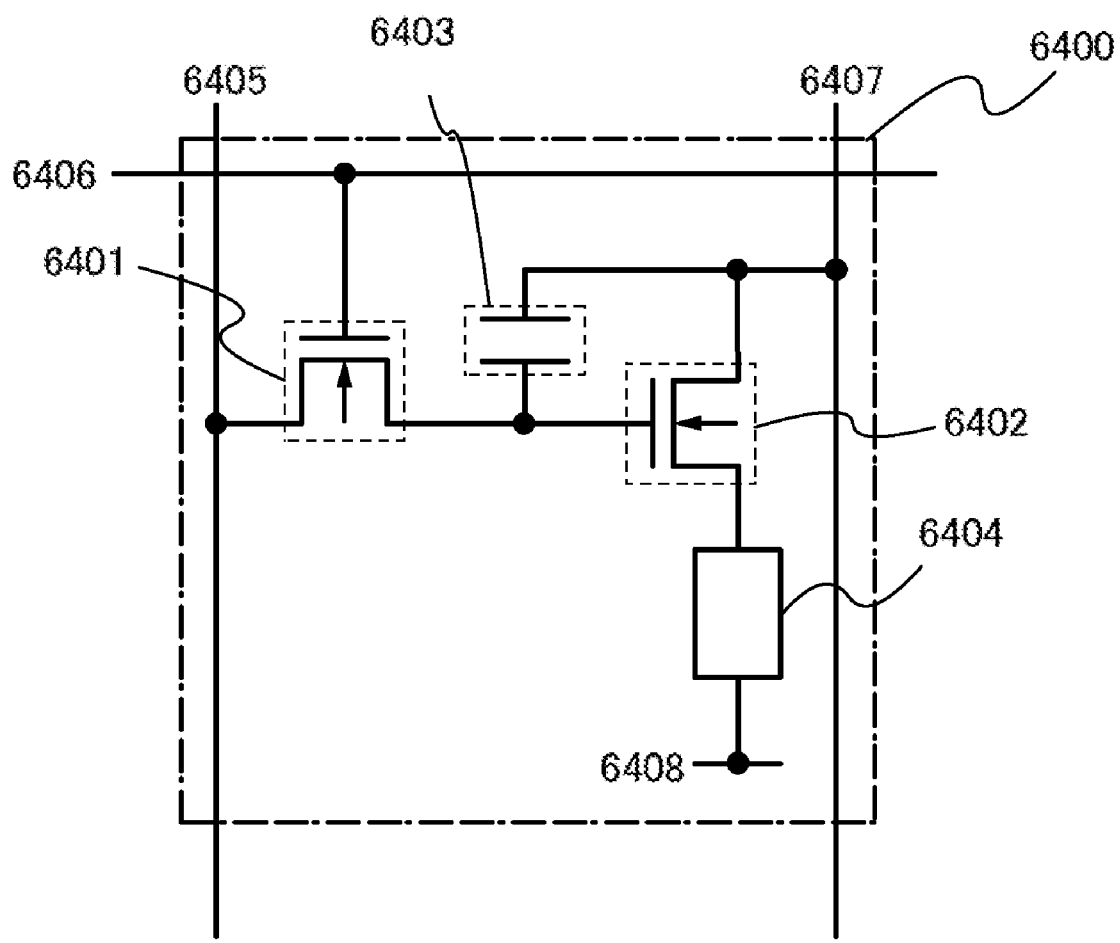
FIG. 16 illustrates a pixel equivalent circuit of a semiconductor device of an embodiment of the present invention.

FIG. 16 illustrates an example of a pixel structure to which digital time grayscale driving can be applied, as an example of a semiconductor device according to one embodiment of the present invention.

A structure and operation of a pixel to which digital time ratio gray scale driving can be applied are described. Here, an example is shown in which a pixel includes two n-channel transistors in each of which a channel formation region is formed using the oxide semiconductor layer including indium, gallium, and zinc which is described in Embodiment 3.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. A gate of the driver transistor 6402 is connected to a power supply line 6407 through the capacitor 6403, a first electrode of the driver transistor 6402 is connected to the power supply line 6407, and a second electrode of the driver transistor 6402 is connected to a first electrode (pixel electrode layer) of the light-emitting element 6404. A second electrode of the light-emitting element 6404 corresponds to a common electrode 6408. The common electrode 6408 is electrically connected to a common potential line formed over the same substrate.

The second electrode of the light-emitting element 6404 (the common electrode 6408) is set to a low power supply potential. The low power supply potential is a potential satisfying the low power supply potential<a high power supply potential with the high power supply potential set to the power supply line 6407 as a reference. For example, GND, 0 V, or the like may be set as the low power supply potential. Here, in order to make the light-emitting element 6404 emit light by applying a potential difference between the high power supply potential and the low power supply potential to the light-emitting element 6404 so as to supply current to the light-emitting element 6404, each potential is set so that the potential difference between the high power supply potential and the low power supply potential is a forward threshold voltage of the light-emitting element 6404 or higher.

Gate capacitance of the driver transistor 6402 may be used as a substitute for the capacitor 6403, so that the capacitor 6403 can be omitted. The gate capacitance of the driver transistor 6402 may be formed between a channel region and a gate electrode layer.

In the case of voltage-input voltage driving method, a video signal is input to the gate of the driver transistor 6402 so that the driver transistor 6402 is in either of two states of being sufficiently turned on and turned off. That is, the driver transistor 6402 operates in a linear region. Since the driver transistor 6402 operates in a linear region, a voltage higher than the voltage of the power supply line 6407 is applied to the gate of the driver transistor 6402. Note that a voltage greater than or equal to (power supply line voltage+$V_{th}$ of the driver transistor 6402) is applied to the signal line 6405.

In the case of performing analog grayscale driving instead of the digital time grayscale driving, the same pixel structure as that in FIG. 16 can be used by changing signal input.

In the case of performing the analog grayscale driving, a voltage greater than or equal to (forward voltage of the light-emitting element 6404+$V_{th}$ of the driver transistor 6402) is applied to the gate of the driver transistor 6402. The forward voltage of the light-emitting element 6404 refers to a voltage to obtain a desired luminance, and includes at least a forward threshold voltage. By the input of the video signal such that the driver transistor 6402 operates in a saturation region, current can be supplied to the light-emitting element 6404. In order that the driver transistor 6402 can operate in the saturation region, the potential of the power supply line 6407 is set higher than a gate potential of the driver transistor 6402. Since the video signal is an analog signal, current in accordance with the video signal can be fed to the light-emitting element 6404, and the analog grayscale driving can be performed.

Note that a pixel structure of the present invention is not limited to the pixel structure shown in FIG. 16. For example, a switch, a resistor, a capacitor, a transistor, a logic circuit, or the like may be added to the pixel shown in FIG. 16.

Next, structures of the light-emitting element are described with reference to FIGS. 17A to 17C. A cross-sectional structure of a pixel is described by taking an n-channel driver TFT as an example. Each of TFTs 7001, 7011, and 7021, which are driver TFTs used for semiconductor devices in FIGS. 17A to 17C can be manufactured in a manner similar to the thin film transistor described in Embodiment 3.

In order to extract light from the light-emitting element, at least one of an anode and a cathode of the light-emitting element is required to be transparent. The thin film transistors and the light-emitting element are formed over the substrate. A light-emitting element can have a top-emission structure in which light emission is extracted through the surface opposite to the substrate; a bottom-emission structure in which light emission is extracted through the surface on the substrate side; or a dual-emission structure in which light emission is extracted through the surface opposite to the substrate and the surface on the substrate side. The pixel structure according to one embodiment of the present invention can be applied to a light-emitting element having any of these emission structures.

A light-emitting element having a top emission structure is described with reference to FIG. 17A.

Figure 17A:
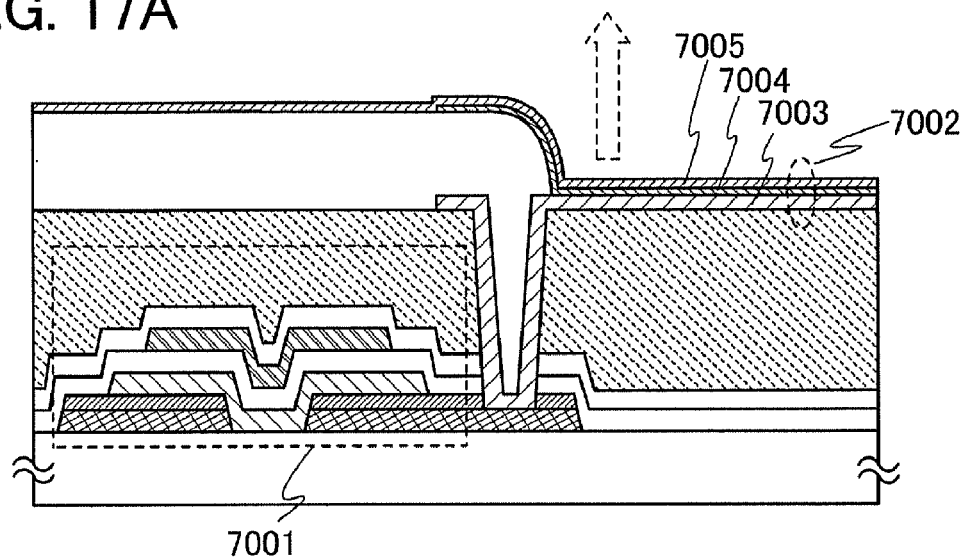
FIGS. 17A to 17C each illustrate a semiconductor device of an embodiment of the present invention.

FIG. 17A is a cross-sectional view of a pixel in the case where the TFT 7001 as the driver TFT is an n-channel TFT and light is emitted from a light-emitting element 7002 to an anode 7005 side. In FIG. 17A, a cathode 7003 of the light-emitting element 7002 is electrically connected to the TFT 7001 as the driver TFT, and a light-emitting layer 7004 and the anode 7005 are stacked in this order over the cathode 7003. The cathode 7003 can be formed using any of a variety of conductive materials as long as they have a low work function and reflect light. For example, Ca, Al, CaF, MgAg, AlLi, or the like is preferably used. The light-emitting layer 7004 may be formed using either a single layer or a stacked of a plurality of layers. If the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide including tungsten oxide, indium zinc oxide including tungsten oxide, indium oxide including titanium oxide, indium tin oxide including titanium oxide, indium tin oxide (hereinafter, referred to as ITO), indium zinc oxide, or indium tin oxide to which silicon oxide is added.

A region where the light-emitting layer 7004 is sandwiched between the cathode 7003 and the anode 7005 corresponds to the light-emitting element 7002. In the case of the pixel illustrated in FIG. 17A, light is emitted from the light-emitting element 7002 to the anode 7005 side as indicated by an arrow.

Next, a light-emitting element having a bottom emission structure is described with reference to FIG. 17B. FIG. 17B is a cross-sectional view of a pixel in a case where the driver TFT 7011 is an n-channel TFT, and light generated in a light-emitting element 7012 is emitted to pass to a cathode 7013 side. In FIG. 17B, the cathode 7013 of the light-emitting element 7012 is formed over a light-transmitting conductive film 7017 that is electrically connected to the driver TFT 7011, and a light-emitting layer 7014 and an anode 7015 are stacked in this order over the cathode 7013. A blocking film 7016 for reflecting or blocking light may be formed so as to cover the anode 7015 when the anode 7015 has a light-transmitting property. For the cathode 7013, a variety of materials can be used as in the case of FIG. 17A as long as they are conductive materials having a low work function. The cathode 7013 has a thickness that can transmit light (preferably, about 5 nm to 30 nm). For example, an aluminum film with a thickness of 20 nm can be used as the cathode 7013. In a similar manner to the case of FIG. 17A, the light-emitting layer 7014 may be formed using either a single layer or a stack of a plurality of layers. The anode 7015 is not required to transmit light, but can be formed using a light-transmitting conductive material as in the case of FIG. 17A. For the blocking film 7016, a metal or the like that reflects light can be used; however, it is not limited to a metal film. For example, a resin or the like to which black pigments are added can be used.

A region where the light-emitting layer 7014 is sandwiched between the cathode 7013 and the anode 7015 corresponds to the light-emitting element 7012. In the case of the pixel illustrated in FIG. 17B, light is emitted from the light-emitting element 7012 to the cathode 7013 side as indicated by an arrow.

Next, a light-emitting element having a dual emission structure is described with reference to FIG. 17C. In FIG. 17C, a cathode 7023 of a light-emitting element 7022 is formed over a light-transmitting conductive film 7027 which is electrically connected to the driver TFT 7021, and a light-emitting layer 7024 and an anode 7025 are stacked in this order over the cathode 7023. As in the case of FIG. 17A, the cathode 7023 can be formed using any of a variety of conductive materials as long as it has a low work function. The cathode 7023 has a thickness at which light can transmit. For example, an Al film having a thickness of 20 nm can be used as the cathode 7023. As in FIG. 17A, the light-emitting layer 7024 may be formed using either a single layer or a stack of a plurality of layers. The anode 7025 can be formed using a light-transmitting conductive material as in the case of FIG. 17A.

A region where the cathode 7023, the light-emitting layer 7024, and the anode 7025 overlap with each other corresponds to the light-emitting element 7022. In the case of the pixel illustrated in FIG. 17C, light is emitted from the light-emitting element 7022 to both the anode 7025 side and the cathode 7023 side as indicated by arrows.

Although an organic EL element is described as the light-emitting element here, it is also possible to provide an inorganic EL element as the light-emitting element.

Embodiment 7 describes an example in which a thin film transistor for controlling the drive of a light-emitting element (the driver TFT) is electrically connected to the light-emitting element. However, a current control TFT may be formed between the driver TFT and the light-emitting element to be connected to them.

Figure 17B:
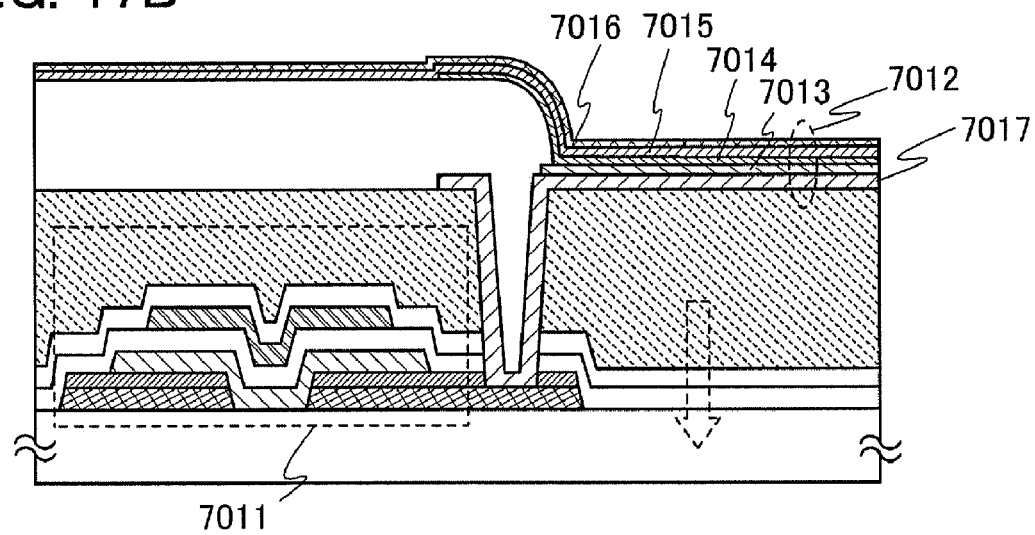
Figure 17C:
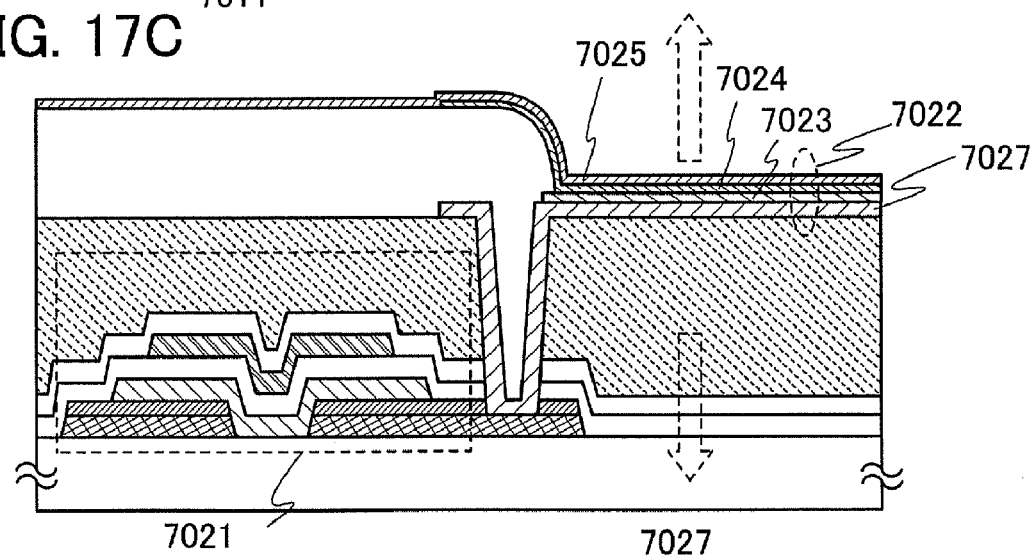

The semiconductor device described in Embodiment 7 is not limited to the structures illustrated in FIGS. 17A to 17C and can be modified in various ways based on the spirit of techniques according to the present invention.

Figure 18A:
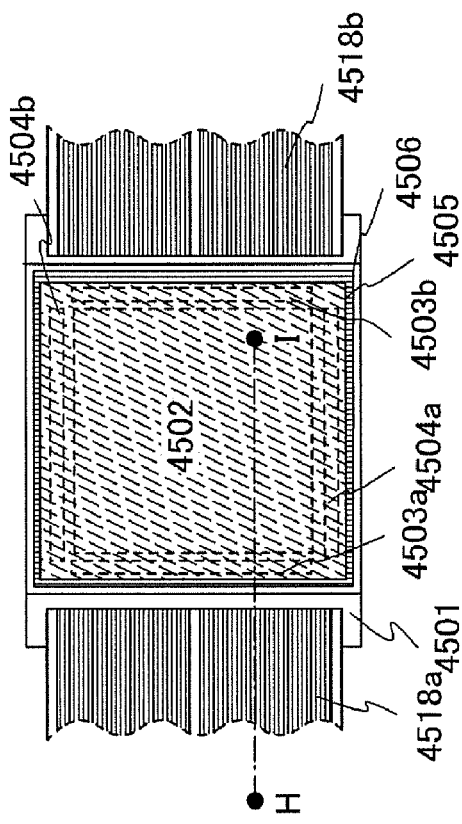
FIG. 18A is a top view and FIG. 18B is a cross-sectional view, both for describing a semiconductor device of an embodiment of the present invention.
Figure 18B:
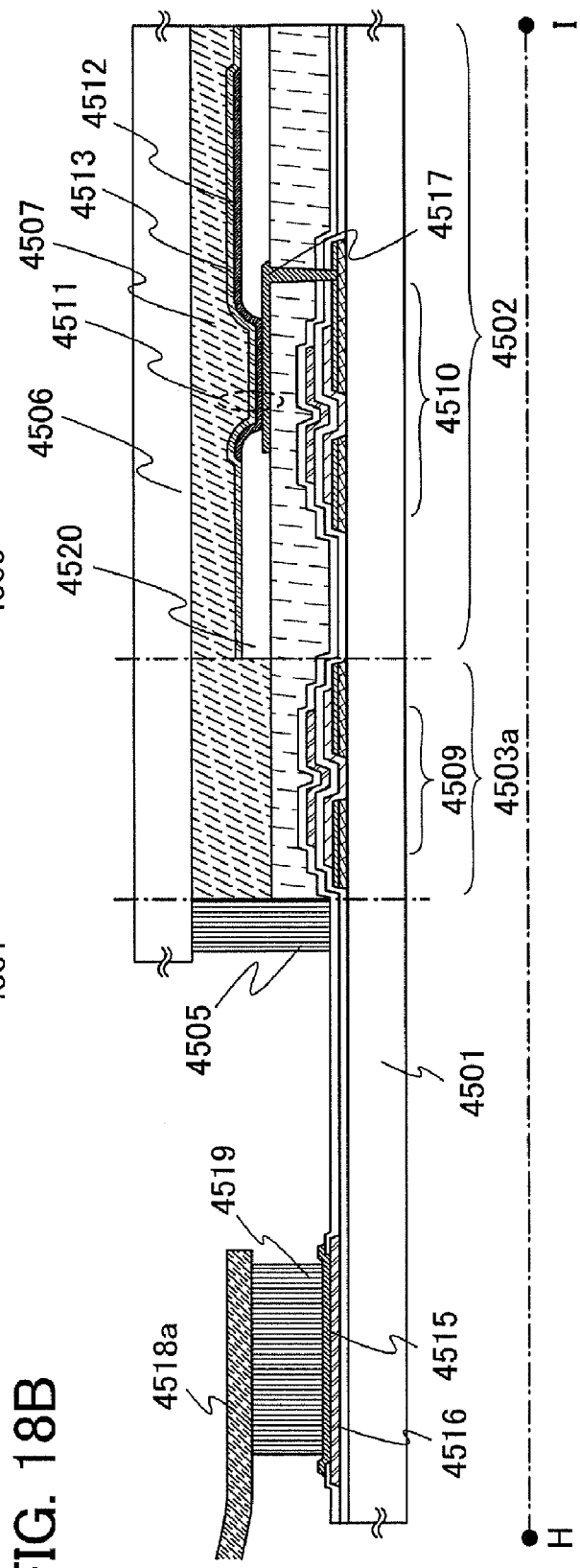

Next, the appearance and a cross section of a light-emitting display panel (also referred to as a light-emitting panel) which corresponds to one mode of a semiconductor device according to the present invention is described with reference to FIGS. 18A and 18B. FIG. 18A is a plan view of a panel in which a thin film transistor which includes an oxide semiconductor layer including indium, gallium, and zinc and which is formed in a manner similar to Embodiment 3, and a light-emitting element are sealed between a first substrate and a second substrate with a sealant. FIG. 18B is a cross-sectional view taken along line H-I of FIG. 18A.

A sealant 4505 is provided so as to surround a pixel portion 4502, signal line driver circuits 4503a and 4503b, and scan line driver circuits 4504a and 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 18B.

The thin film transistors 4509 and 4510 are n-channel thin film transistors, and the thin film transistor described in Embodiment 3 can be used as each of them.

Moreover, reference numeral 4511 denotes a light-emitting element. A first electrode layer 4517 which is a pixel electrode layer included in the light-emitting element 4511 is electrically connected to a source electrode layer or a drain electrode layer of the thin film transistor 4510. Note that although the light-emitting element 4511 has a stacked structure including the first electrode layer 4517, an electroluminescent layer 4512, and the second electrode layer 4513, the structure of the light-emitting element 4511 is not limited to the stack structure described in Embodiment 9. The structure of the light-emitting element 4511 can be changed as appropriate depending on the direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material so as to have an opening over the first electrode layer 4517 and that the opening have a sidewall with an inclined surface with continuous curvature.

The electroluminescent layer 4512 may be formed as a single layer or a plurality of layers stacked.

A protective film may be formed over the second electrode layer 4513 and the partition wall 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

A variety of signals and potentials are supplied to the signal line driver circuits 4503a and 4503b, the scan line driver circuits 4504a and 4504b, or the pixel portion 4502 from FPCs 4518a and 4518b.

In Embodiment 7, a connection terminal electrode 4515 is formed using the same conductive film as the first electrode layer 4517 included in the light-emitting element 4511, and a terminal electrode 4516 is formed using the same conductive film as the source and drain electrode layers included in the thin film transistors 4509 and 4510.

The connection terminal electrode 4515 is electrically connected to a terminal of the FPC 4518a through an anisotropic conductive film 4519.

The second substrate 4506 located in the direction in which light is extracted from the light-emitting element 4511 should have a light-transmitting property. In that case, a material with a light-transmitting property, such as a glass plate, a plastic sheet, a polyester film, or an acrylic film is used.

As the filler 4507, an ultraviolet curable resin or a thermosetting resin as well as inert gas such as nitrogen or argon can be used. For example, polyvinyl chloride (PVC), acrylic, polyimide, an epoxy resin, a silicone resin, polyvinyl butyral (PVB), or ethylene vinyl acetate (EVA) can be used. In Embodiment 7, nitrogen is used as the filler 4507.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, the polarizing plate or the circularly polarizing plate may be provided with an anti-reflection film. For example, anti-glare treatment may be carried out by which reflected light can be diffused by projections and depressions on the surface so as to reduce the glare.

The signal line driver circuits 4503a and 4503b and the scan line driver circuits 4504a and 4504b may be mounted as driver circuits formed using a single crystal semiconductor film or a polycrystalline semiconductor film over a substrate separately prepared. In addition, only the signal line driver circuit or part thereof, or the scan line driver circuit or part thereof may be separately formed to be mounted. Embodiment 7 is not limited to the structure shown in FIGS. 18A and 18B.

Through the above steps, a display device including the thin film transistor whose operation stability is excellent can be manufactured. Since the light-emitting display device (display panel) of Embodiment 7 includes the thin film transistor whose operation stability is excellent, the reliability of the light-emitting display device is high.

Embodiment 7 can be implemented in combination with any of the structures of Embodiments in this specification as appropriate.

Embodiment 8

Figure 19A:
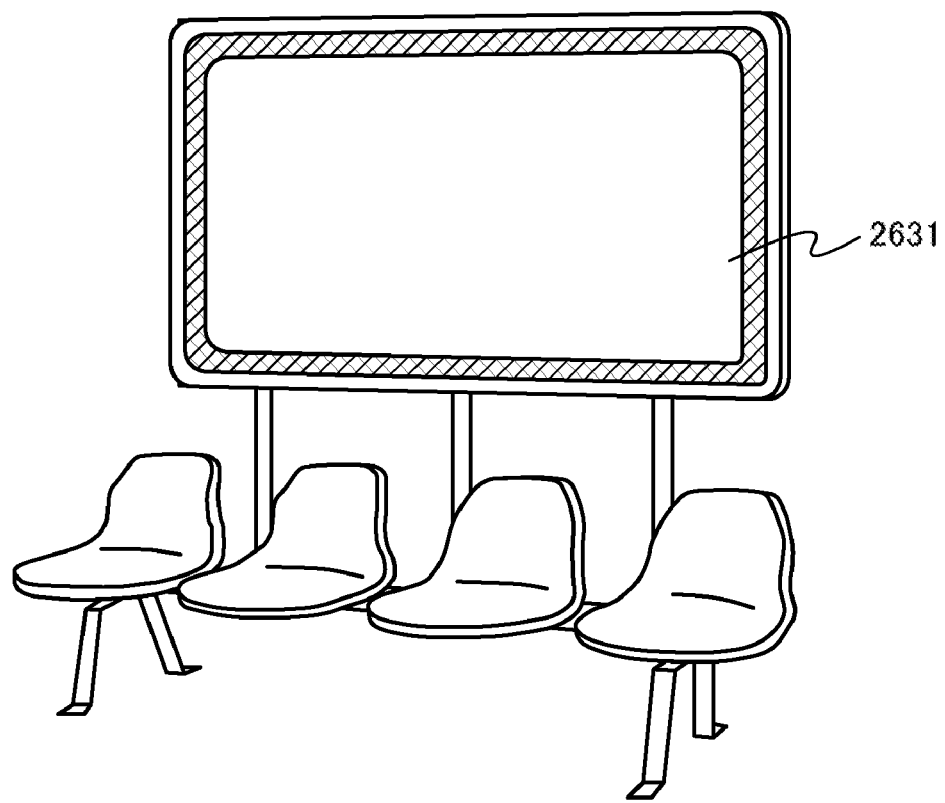
FIGS. 19A and 19B each illustrate an example of a usage pattern of electronic paper.
Figure 19B:
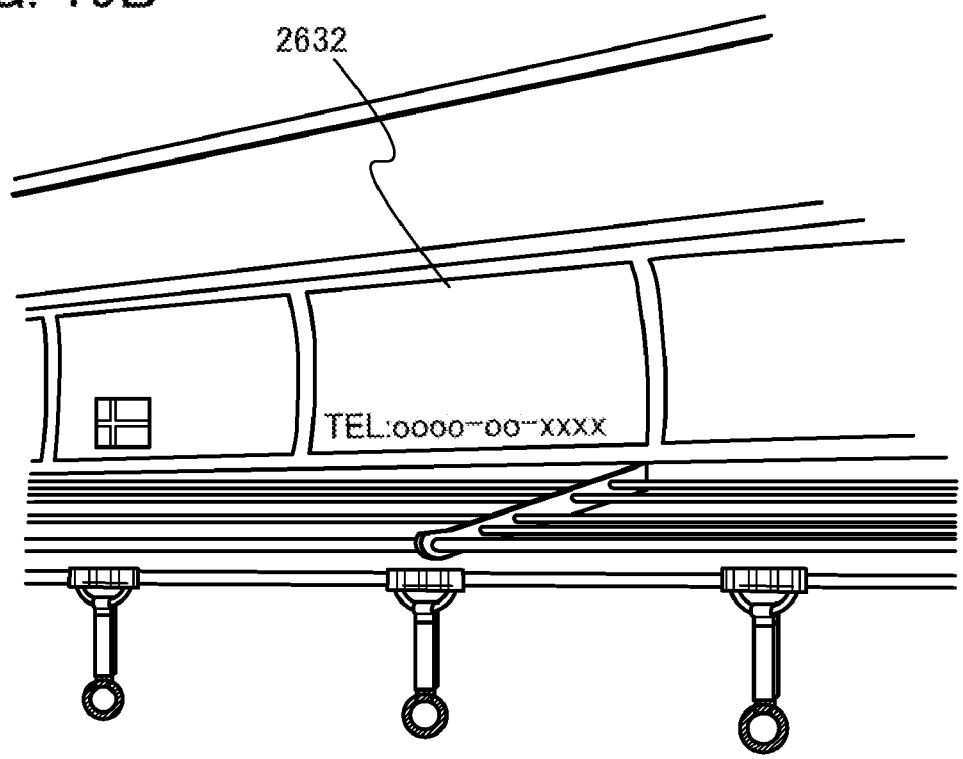
Figure 20:
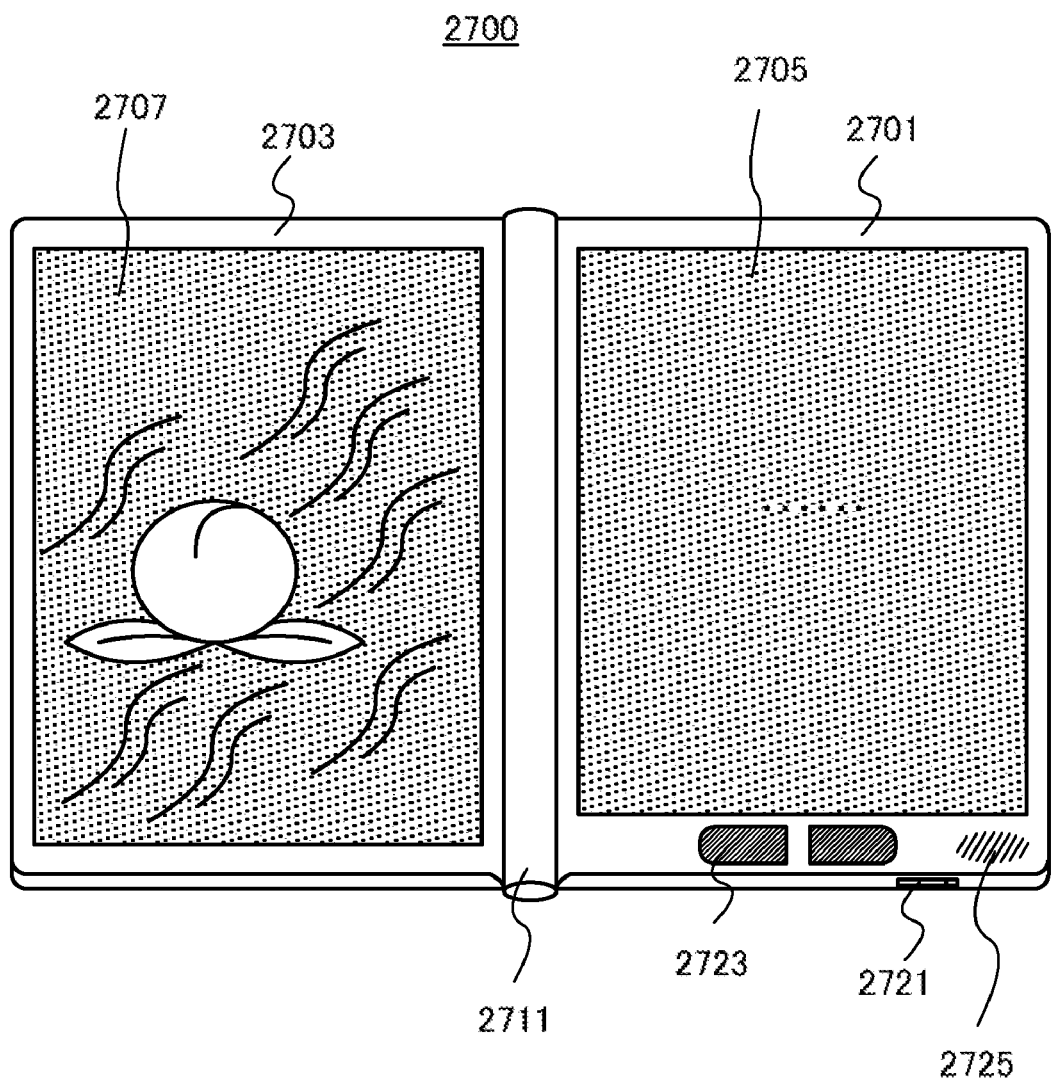
FIG. 20 is an external view illustrating an example of electronic book.

A display device according to one embodiment of the present invention can be applied as electronic paper. Electronic paper can be used for electronic appliances of a variety of fields as long as they can display data. For example, electronic paper can be applied to an e-book (electronic book) device, a poster, an advertisement in a vehicle such as a train, or displays of a variety of cards such as a credit card. FIGS. 19A and 19B and FIG. 20 illustrate examples of the semiconductor device.

FIG. 19A illustrates a poster 2631 formed using electronic paper. If the advertising medium is printed paper, the advertisement is replaced by manpower; however, when electronic paper according to one embodiment of the present invention is used, the advertisement display can be changed in a short time. Furthermore, stable images can be obtained without display defects. Note that the poster may have a configuration capable of wirelessly transmitting and receiving data.

FIG. 19B illustrates an advertisement 2632 in a vehicle such as a train. If the advertising medium is printed paper, the advertisement is replaced by manpower; however, when electronic paper according to one embodiment of the present invention is used, the advertisement display can be changed in a short time without much manpower. Furthermore, stable images can be obtained without display defects. Note that the advertisement in a vehicle may have a configuration capable of wirelessly transmitting and receiving data.

FIG. 20 illustrates an example of an electronic book device 2700. For example, the electronic book device 2700 includes two housings, a housing 2701 and a housing 2703. The housings 2701 and 2703 are bound with each other by an axis portion 2711, along which the electronic book device 2700 is opened and closed. With such a structure, the electronic book device 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 20) and graphics can be displayed on a display portion on the left side (the display portion 2707 in FIG. 20).

FIG. 20 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Further, a rear surface or a side surface of the housing may be provided with an external connection terminal (an earphone terminal, a USB terminal, a terminal which can be connected with a variety of cables such as an AC adapter or a USB cable, and the like), a storage medium inserting portion, or the like. Moreover, the electronic book device 2700 may have a function of an electronic dictionary.

The electronic book device 2700 may have a configuration capable of wirelessly transmitting and receiving data. Through wireless communication, desired book data or the like can be purchased and downloaded from an electronic book server.

Through the above steps, a display device including a thin film transistor whose operation stability is excellent can be manufactured. The semiconductor device including the thin film transistor whose operation stability is excellent has high reliability.

Embodiment 9

A semiconductor device according to one embodiment of the present invention can be applied to a variety of electronic appliances (including game machines). Examples of the electronic appliances include television sets (also referred to as televisions or television receivers), monitors of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 21A:
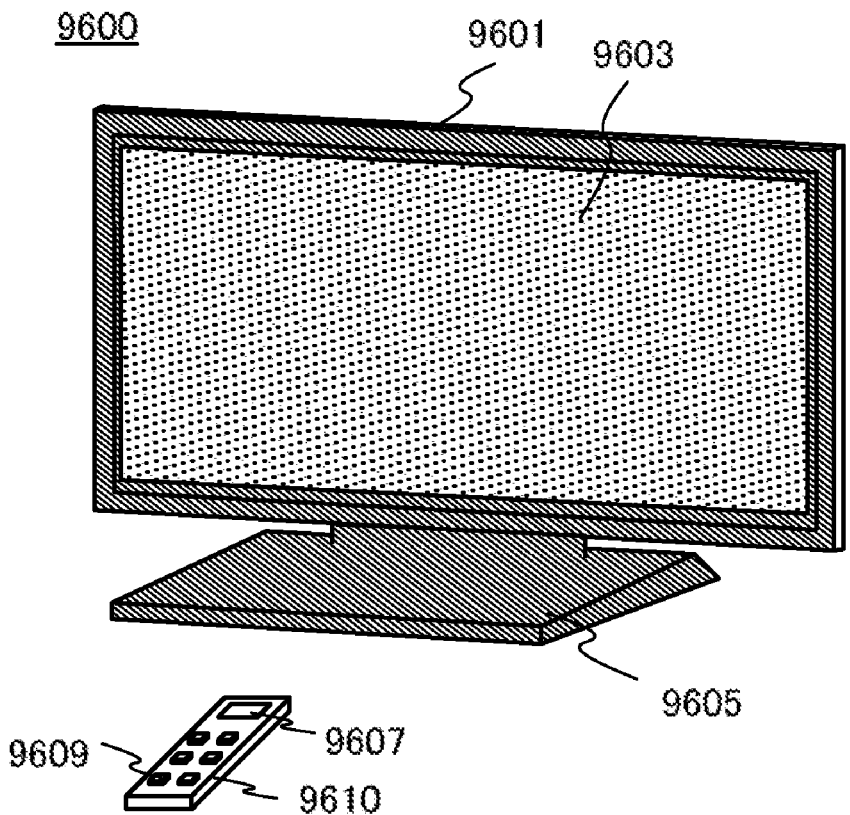
FIG. 21A is an external view of an example of a television set and FIG. 21B is an external view of an example of a digital photo frame.

FIG. 21A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data to be output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 21B:
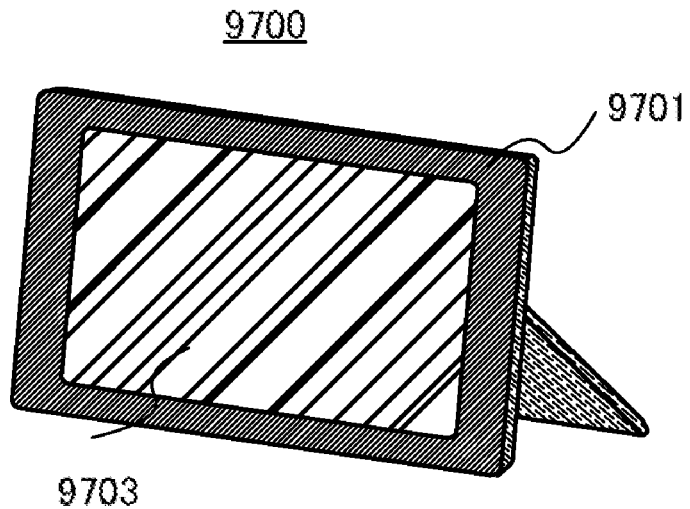

FIG. 21B illustrates an example of a digital photo frame 9700. For example, in the digital photo frame 9700, a display portion 9703 is incorporated in a housing 9701. A variety of images can be displayed on the display portion 9703. For example, the display portion 9703 can display data of an image taken by a digital camera or the like so as to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these portions may be provided on the same surface as the display portion, it is preferable to provide them on a side surface or a back surface for improving the design of the digital photo frame 9700. For example, a memory in which data of images taken by a digital camera are stored is inserted in the recording medium insertion portion of the digital photo frame, whereby the image data can be imported and displayed on the display portion 9703.

The digital photo frame 9700 may transmit and receive data wirelessly. Through wireless communication, desired image data can be imported to be displayed.

Figure 22A:
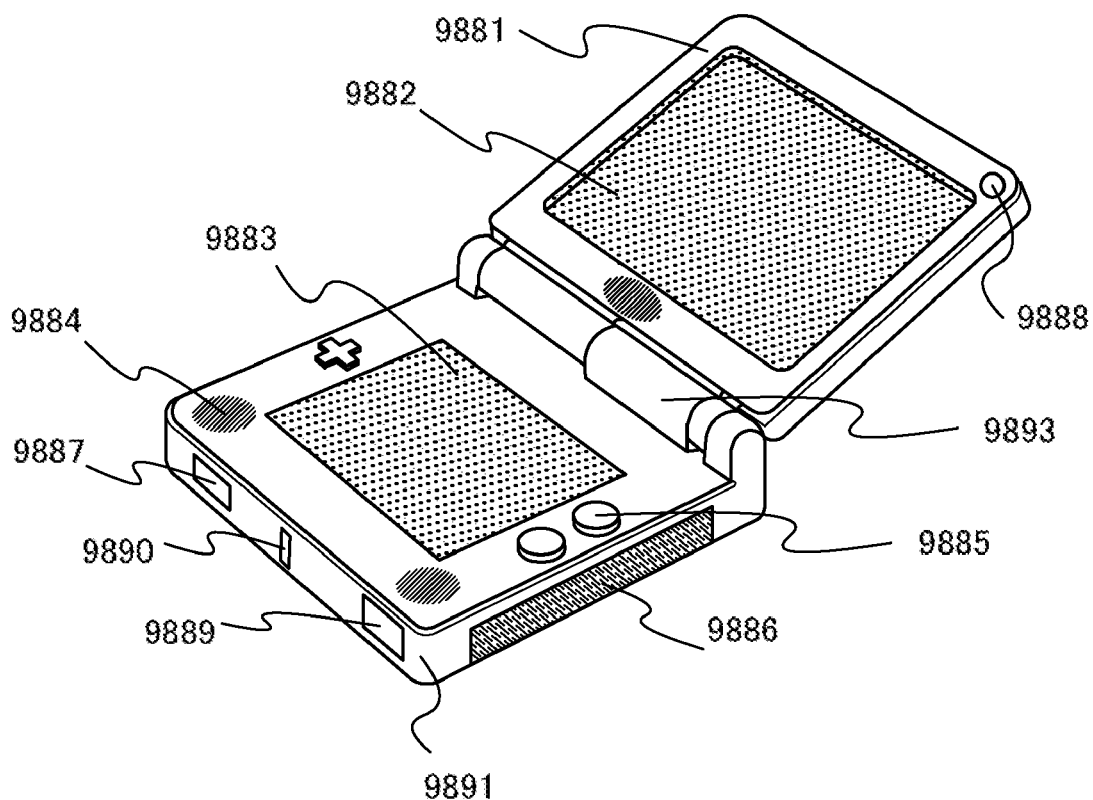
FIGS. 22A and 22B are external views of examples of amusement machines.

FIG. 22A illustrates a portable game console including two housings, a housing 9881 and a housing 9891. The housings 9881 and 9891 are connected to each other with a connection portion 9893 so as to be opened and closed. A display portion 9882 and a display portion 9883 are incorporated in the housing 9881 and the housing 9891, respectively. The portable game console illustrated in FIG. 22A additionally includes a speaker portion 9884, a storage medium insertion portion 9886, an LED lamp 9890, an input means (operation keys 9885, a connection terminal 9887, a sensor 9888 (including a function of measuring force, displacement, position, speed, acceleration, angular speed, the number of rotations, distance, light, liquid, magnetism, temperature, chemical substance, sound, time, hardness, electric field, current, voltage, electric power, radiation, flow rate, humidity, tilt angle, vibration, smell, or infrared ray), a microphone 9889), and the like. Needless to say, the structure of the portable game console is not limited to the above, and may be any structure as long as a semiconductor device according to one embodiment of the present invention is provided. Moreover, another accessory may be provided as appropriate. The portable game console illustrated in FIG. 22A has a function of reading out a program or data stored in a storage medium to display it on the display portion, and a function of sharing information with another portable game console by wireless communication.

Note that the functions of the portable game console illustrated in FIG. 22A are not limited to those above, and a variety of functions can be provided.

Figure 22B:
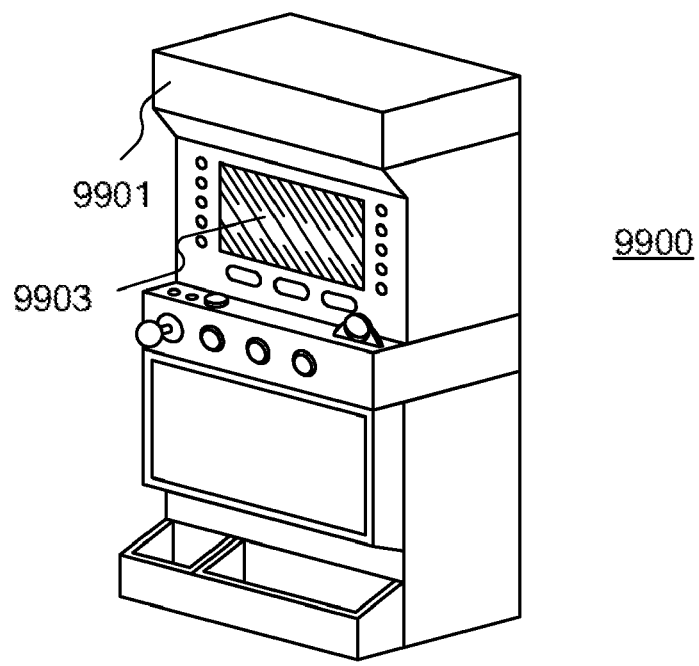

FIG. 22B illustrates an example of a slot machine 9900 which is a large-sized game machine. In the slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above, and may be any structure as long as at least a semiconductor device according to one embodiment of the present invention is provided. Moreover, another accessory may be provided as appropriate.

Figure 23:
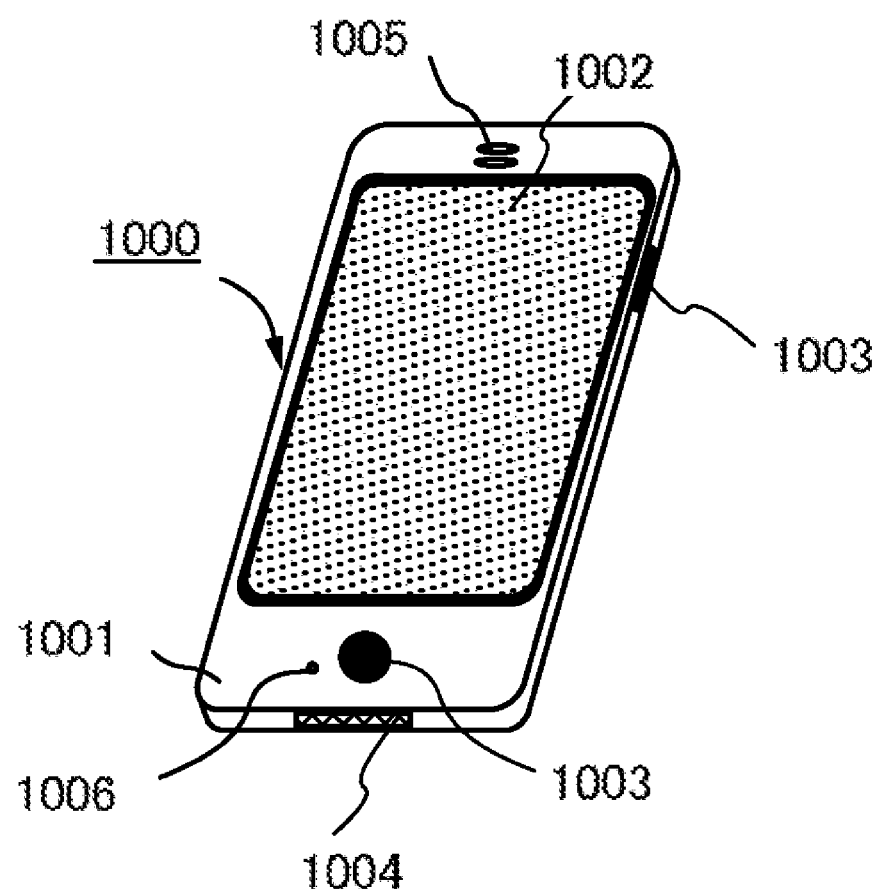
FIG. 23 is an external view of an example of a cellular phone.

FIG. 23 illustrates an example of a cellular phone 1000. The cellular phone 1000 is provided with a display portion 1002 incorporated in a housing 1001, operation buttons 1003, an external connection port 1004, a speaker 1005, a microphone 1006, and the like.

Information can be input to the cellular phone 1000 illustrated in FIG. 23 by touching the display portion 1002 with a finger or the like. Furthermore, operations such as making a phone call and composing a mail can be performed by touching the display portion 1002 with a finger or the like.

There are mainly three screen modes of the display portion 1002. The first mode is a display mode mainly for displaying an image. The second mode is an input mode mainly for inputting information such as text. The third mode is a display-and-input mode in which two modes of the display mode and the input mode are mixed.

For example, in the case of making a phone call or composing a mail, the display portion 1002 is set to a text input mode where text input is mainly performed, and text input operation can be performed on a screen. In that case, it is preferable to display a keyboard or number buttons on almost all the area of the screen of the display portion 1002.

When a detection device including a sensor for detecting inclination, such as a gyroscope or an acceleration sensor, is provided inside the cellular phone 1000, display on the screen of the display portion 1002 can be automatically switched by determining the direction of the cellular phone 1000 (whether the cellular phone 1000 is placed horizontally or vertically for a landscape mode or a portrait mode).

The screen mode is switched by touching the display portion 1002 or operating the operation buttons 1003 of the housing 1001. Alternatively, the screen modes can be switched depending on kinds of images displayed in the display portion 1002. For example, when a signal for an image displayed in the display portion is data of moving images, the screen mode is switched to the display mode. When the signal is text data, the screen mode is switched to the input mode.

Moreover, in the input mode, when input by touching the display portion 1002 is not performed for a specified period while a signal detected by the optical sensor in the display portion 1002 is detected, the screen mode may be controlled so as to be switched from the input mode to the display mode.

The display portion 1002 can also function as an image sensor. For example, an image of a palm print, a fingerprint, or the like is taken by touching the display portion 1002 with the palm or the finger, whereby personal authentication can be performed. Furthermore, with the use of a backlight or a sensing light source which is provided for the display portion and which emits near-infrared light, an image of a finger vein, a palm vein, or the like can also be taken.

Through the above steps, an electronic appliance including a thin film transistor whose operation stability is excellent can be manufactured. Since the electronic appliance includes the thin film transistor whose operation stability is excellent, the reliability of the electronic appliance is high.

EXAMPLE 1

In Example 1, a process for manufacturing a thin film transistor and characteristics of the thin film transistor are described.

Figure 24:
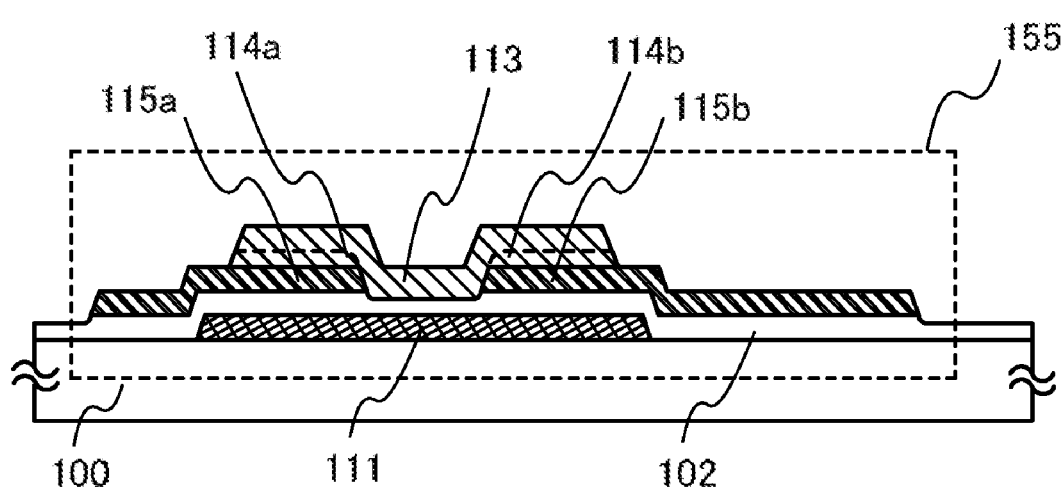
FIG. 24 is a cross-sectional view of a thin film transistor of Embodiment 1.

FIG. 24 illustrates a structure of the thin film transistor of Example 1. In a thin film transistor 155 of Example 1, a gate electrode layer 111 is formed over a substrate 100, a gate insulating film 102 is formed over the gate electrode layer 111, and a first electrode layer 115a and a second electrode layer 115b serving as a source electrode layer and a drain electrode layer are formed over the gate insulating film 102 so that end portions of the first electrode layer 115a and the second electrode layer 115b overlap with the gate electrode layer 111. A first semiconductor layer 113 is provided so as to overlap with the gate electrode layer 111 and to be in contact with the gate insulating film 102, side face portions of the first electrode layer 115a and the second electrode layer 115b, and side face portions and top face portions of a first protective layer 114a and a second protective layer 114b.

In Example 1, a substrate of alkali-free glass with a thickness of 0.7 mm (EAGLE 2000 manufactured by Corning Incorporated) was used as the substrate 100. Next, a tungsten film which serves as a gate electrode is formed to a thickness of 100 nm by a sputtering method. Then, an unnecessary portion of the tungsten film is removed by etching with the use of a resist mask formed using a photomask, whereby a wiring and the gate electrode layer are formed. Here, the etching is performed so that at least an end portion of the gate electrode layer is tapered for preventing disconnection.

Next, a silicon oxide film is formed as the gate insulating film 102 over the substrate 100 and the gate electrode layer 111 to a thickness of 100 nm by a plasma CVD method.

Then, a titanium film is formed as a conductive film serving as a source electrode layer and a drain electrode layer to a thickness of 100 nm by a sputtering method.

After the formation of the titanium film serving as a source electrode layer and a drain electrode layer, a second semiconductor layer is formed successively without the titanium film being exposed to air. In Example 1, a multichamber type sputtering apparatus in which a plurality of chambers is connected to a transfer chamber is used, and without the titanium film being exposed to air, the substrate is transferred to a chamber where the second semiconductor layer is formed.

In Example 1, an oxide semiconductor film including indium, gallium, and zinc is formed as the second semiconductor layer over the titanium film by a sputtering method. The second semiconductor layer is formed using a target with a diameter of 12 inches (In:Ga:Zn=1:1:0.5) formed by sintering with a composition ratio among indium oxide, gallium oxide, and zinc oxide being set to 1:1:1 (=$In_2O_3$:$Ga_2O_3$:ZnO). The distance between the substrate and the target is set to 60 mm. The sputtering method is carried out under a condition where the pressure is 0.4 Pa, the direct current (DC) power source is 0.5 kW, and the atmosphere is a mixture of argon and oxygen (argon:oxygen=10:5). Note that the thickness of the second semiconductor layer is 5 nm.

Next, an unnecessary portion of the second semiconductor layer is removed by etching with the use of a resist mask formed using a photomask, whereby the first protective layer 114a and the second protective layer 114b are formed. Next, the same resist mask is used for etching an unnecessary portion of the titanium film, whereby a wiring and the first electrode layer 115a and the second electrode layer 115b serving as a source electrode layer and a drain electrode layer are formed.

Before the formation of the first semiconductor layer 113, an oxygen gas and an argon gas are introduced and reverse sputtering is performed on the first protective layer 114a, the second protective layer 114b, and the exposed surface of the gate insulating film 102, and irradiation with oxygen radical or oxygen is performed; thus, dust and impurities on the surface are removed. Due to the reverse sputtering, in some cases, end portions of the gate insulating film 102, the first protective layer 114a, and the second protective layer 114b are slightly thinned or rounded because the surface is shaved. When the end portions of the first protective layer 114a and the second protective layer 114b are shaved to have small tapered angles, the first semiconductor layer 113 to be stacked thereover can easily cover the tapered portion; therefore, disconnection does not easily occur.

Next, an oxide semiconductor film including indium, gallium, and zinc, which serves as the first semiconductor layer 113, is formed to a thickness of 100 nm by a sputtering method. Since the first semiconductor layer and the second semiconductor layer are formed under the same condition in Example 1, the second semiconductor layer has a conductivity that is less than or equal to that of the first semiconductor layer. Next, an unnecessary portion of the first semiconductor layer 113 is removed by etching with the use of a resist mask formed using a photomask, whereby the thin film transistor 155 is formed.

Next, the substrate over which the thin film transistor 155 has been formed is subjected to thermal treatment in a furnace at 350° C. for an hour in a nitrogen atmosphere. Through this thermal treatment, rearrangement at the atomic level occurs in an In—Ga—Zn—O-based non-single-crystal film included in the oxide semiconductor film. Because strain energy which inhibits carrier movement is released by the thermal treatment, this thermal treatment (also including photo-annealing) is important.

Figure 25:
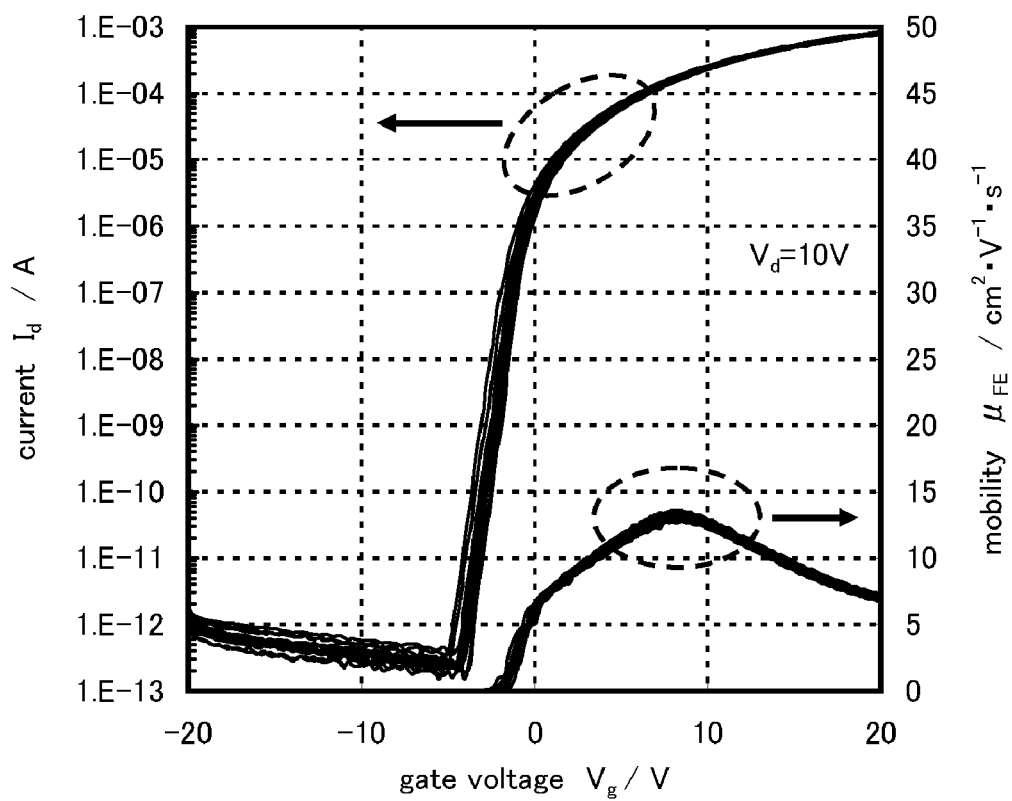
FIG. 25 shows electrical characteristics of a thin film transistor of Embodiment 1.

Electrical characteristics of fifteen thin film transistors each having a channel length of 10 μm and a channel width of 100 μm manufactured over one substrate in Example 1 were measured. The results are shown in FIG. 25. In this manner, fifteen thin film transistors with suppressed variation were manufactured over one substrate. Note that the on current $I_{on}$ was high at $2 \times 10^{-4}$ A at a gate voltage $V_g$ of 10 V and a drain voltage $V_d$ of 10 V. Moreover, the minimum off current ($I_{off\_min}$) was low at $1 \times 10^{-12}$ A, and a high on/off ratio of $10^8$ or more was observed. Further, a high electric field effect mobility over 13 cm$^2$/Vs was observed. The thin film transistor manufactured in Example 1 has not just suppressed variation but a high on/off ratio. Moreover, high electric field effect mobility was achieved.

This application is based on Japanese Patent Application serial No. 2008-330611 filed with Japan Patent Office on Dec. 25, 2008, the entire contents of which are hereby incorporated by reference.

What is claimed is:
1. A semiconductor device comprising:
a gate electrode layer;
a gate insulating film provided over the gate electrode layer;
a first electrode layer and a second electrode layer whose end portions overlap with the gate electrode layer provided over the gate insulating film;
a first protective layer provided over the first electrode layer;
a second protective layer provided over the second electrode layer; and
a first semiconductor layer provided to overlap with the gate electrode layer and to be in contact with the gate insulating film, side face portions of the first electrode layer and the second electrode layer, and side face por- tions and top face portions of the first protective layer and the second protective layer,
wherein the first protective layer and the second protective layer have a conductivity that is less than that of the first semiconductor layer, and
wherein the first protective layer and the second protective layer each have smaller thickness than the first semiconductor layer.

2. The semiconductor device according to claim 1, wherein the first protective layer and the second protective layer are formed using a composition including the same element as the first semiconductor layer.

3. The semiconductor device according to claim 1, wherein the first semiconductor layer includes an oxide semiconductor.

4. The semiconductor device according to claim 1, wherein the first semiconductor layer includes a semiconductor including indium, gallium, and zinc.

5. The semiconductor device according to claim 1, wherein a second semiconductor layer which has a conductivity that is less than or equal to that of the first semiconductor layer and which has smaller thickness than the first semiconductor layer is provided over the first electrode layer and the second electrode layer.

6. A semiconductor device comprising:
a first electrode layer and a second electrode layer;
a first protective layer provided over the first electrode layer;
a second protective layer provided over the second electrode layer;
a first semiconductor layer provided in contact with side face portions of the first electrode layer and the second electrode layer and side face portions and top face portions of the first protective layer and the second protective layer;
a gate insulating film provided over the first semiconductor layer; and
a gate electrode layer provided to overlap with end portions of the first electrode layer and the second electrode layer via the gate insulating film,
wherein the first protective layer and the second protective layer have a conductivity that is less than that of the first semiconductor layer, and
wherein the first protective layer and the second protective layer each have smaller thickness than the first semiconductor layer.

7. The semiconductor device according to claim 6, wherein the first protective layer and the second protective layer are formed using a composition including the same element as the first semiconductor layer.

8. The semiconductor device according to claim 6, wherein the first semiconductor layer includes an oxide semiconductor.

9. The semiconductor device according to claim 6, wherein the first semiconductor layer includes a semiconductor including indium, gallium, and zinc.

10. The semiconductor device according to claim 6, wherein a second semiconductor layer which has a conductivity that is less than or equal to that of the first semiconductor layer and which has smaller thickness than the first semiconductor layer is formed over the first electrode layer and the second electrode layer.

11. A method for manufacturing a semiconductor device, comprising the steps of:
forming a gate electrode layer;
forming a gate insulating film over the gate electrode layer;
forming a first electrode layer and a second electrode layer over the gate insulating film;
forming a first protective layer provided over the first electrode layer;
forming a second protective layer provided over the second electrode layer; and
forming a first semiconductor layer provided to overlap with the gate electrode layer and to be in contact with the gate insulating film, side face portions of the first electrode layer and the second electrode layer, and top face portions and side face portions of the first protective layer and the second protective layer,
wherein the first protective layer and the second protective layer have a conductivity that is less than that of the first semiconductor layer, and
wherein the first protective layer and the second protective layer each have smaller thickness than the first semiconductor layer.

12. The method for manufacturing a semiconductor device according to claim 11, further comprising the step of forming a stack of films by forming a conductive film and then successively forming a second semiconductor film over the conductive film without the conductive film exposed to air,
wherein the first electrode layer and the second electrode layer each including the first protective layer and the second protective layer are formed using the stack of films.

13. A method for manufacturing a semiconductor device, comprising the steps of:
forming a first electrode layer and a second electrode layer;
forming a first protective layer provided over the first electrode layer;
forming a second protective layer provided over the second electrode layer;
forming a first semiconductor layer provided to be in contact with side face portions of the first electrode layer and the second electrode layer and top face portions and side face portions of the first protective layer and the second protective layer;
forming a gate insulating film provided over the first semiconductor layer; and
forming a gate electrode layer provided to overlap with end portions of the first electrode layer and the second electrode layer via the gate insulating film,
wherein the first protective layer and the second protective layer have a conductivity that is less than that of the first semiconductor layer, and
wherein the first protective layer and the second protective layer each have smaller thickness than the first semiconductor layer.

14. The method for manufacturing a semiconductor device according to claim 13, further comprising the step of forming a stack of films by forming a conductive film and then successively forming a second semiconductor film over the conductive film without the conductive film exposed to air,
wherein the first electrode layer and the second electrode layer each including the first protective layer and the second protective layer are formed using the stack of films.

* * * * *

UNITED STATES PATENT AND TRADEMARK OFFICE
CERTIFICATE OF CORRECTION

PATENT NO. : 8,383,470 B2
APPLICATION NO. : 12/634084
DATED : February 26, 2013
INVENTOR(S) : Kengo Akimoto et al.

Page 1 of 1

It is certified that error appears in the above-identified patent and that said Letters Patent is hereby corrected as shown below:

In the Specifications

At column 3, line 46, "MN" should be --AlN--;

At column 7, line 38, "1:1:4=" should be --1:1:1(=--;

At column 40, line 39, "$I_{on}$" should be --($I_{on}$)--.

Signed and Sealed this
Seventh Day of May, 2013

Teresa Stanek Rea
*Acting Director of the United States Patent and Trademark Office*